(12) United States Patent
Ogawa et al.

(10) Patent No.: US 6,770,901 B1
(45) Date of Patent: Aug. 3, 2004

(54) RADIATION SOLID-STATE DETECTORS, AND RADIATION IMAGE RECORD-READING METHOD AND DEVICE USING THE SAME

(75) Inventors: Masaharu Ogawa, Kaisei-machi (JP); Shinji Imai, Kaisei-machi (JP); Toshitaka Agano, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/539,412

(22) Filed: Mar. 30, 2000

(30) Foreign Application Priority Data

Mar. 30, 1999 (JP) ............................................ 11-087922

(51) Int. Cl.[7] ................................................ G01T 1/24
(52) U.S. Cl. ...................................... 250/591; 250/580
(58) Field of Search ................................ 250/591, 580

(56) References Cited

U.S. PATENT DOCUMENTS

| | | | |
|---|---|---|---|
| 4,085,327 A | * | 4/1978 | Swank et al. .................. 378/29 |
| 4,535,468 A | | 8/1985 | Kempter ...................... 378/31 |
| 5,196,702 A | * | 3/1993 | Tsuji et al. .................. 250/591 |

FOREIGN PATENT DOCUMENTS

| | | |
|---|---|---|
| EP | 0 574 689 | 12/1993 |
| EP | 0 898 421 | 2/1999 |
| JP | 10-232824 | 2/1998 |
| JP | 10-271374 | 9/1998 |

* cited by examiner

*Primary Examiner*—Constantine Hannaher
*Assistant Examiner*—Shun Lee
(74) *Attorney, Agent, or Firm*—Sughrue Mion, PLLC

(57) ABSTRACT

With a detector 10 with which a first electrode layer 11, a photoconductive layer for recording, 12, exhibiting conductivity when irradiated with recording light L1, a charge transporting layer 13 acting roughly as a conductor for transported charges opposite in polarity to the latent image charges, a photoconductive layer for reading, 14, exhibiting conductivity when irradiated with reading light L2, and an electrode layer 15 having a stripe electrode are stacked together, a sub-electrode 17, a number of elements 17a of which are each located just above an element 16a, being disposed so that they are opposed to each other, is provided in the vicinity of a charge storing section 19 in the photoconductive layer for recording, 12. In recording, a specified control voltage is applied to the sub-electrode 17 from a power supply 73. In reading, the current flowing out from each element 17a of the sub-electrode 17 is detected.

8 Claims, 26 Drawing Sheets

X-Z SECTION

X-Y SECTION

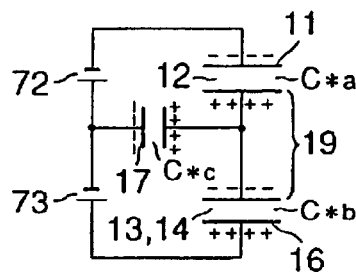
FIG. 8A
PERMEATING PORTION → FIG. 8B
SHADING PORTION → FIG. 8E
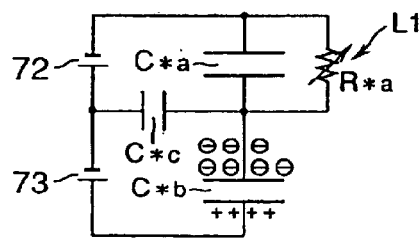
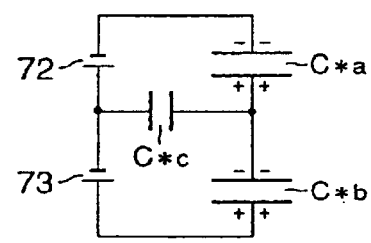
FIG. 8B  FIG. 8E
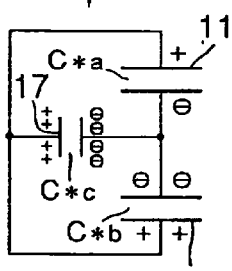
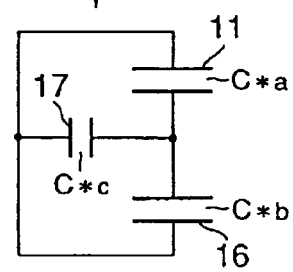
FIG. 8C  FIG. 8F
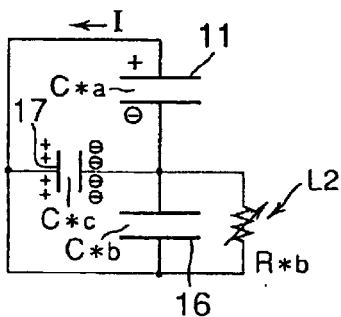
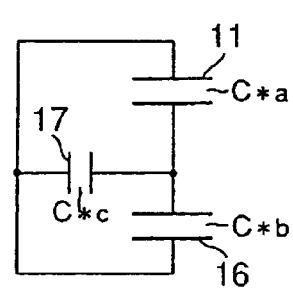
FIG. 8D  FIG. 8G

X-Z SECTION

X-Y SECTION

X-Z SECTION

X-Y SECTION

F I G. 12A
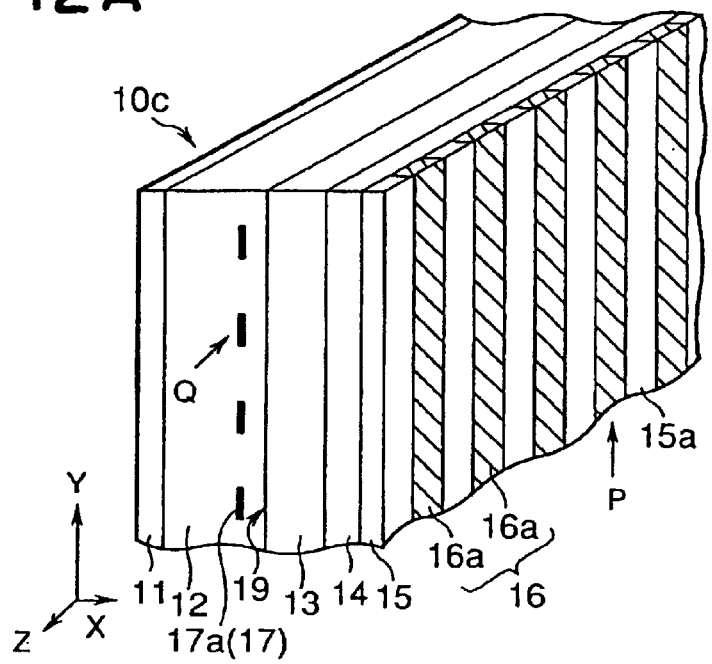
F I G. 12B
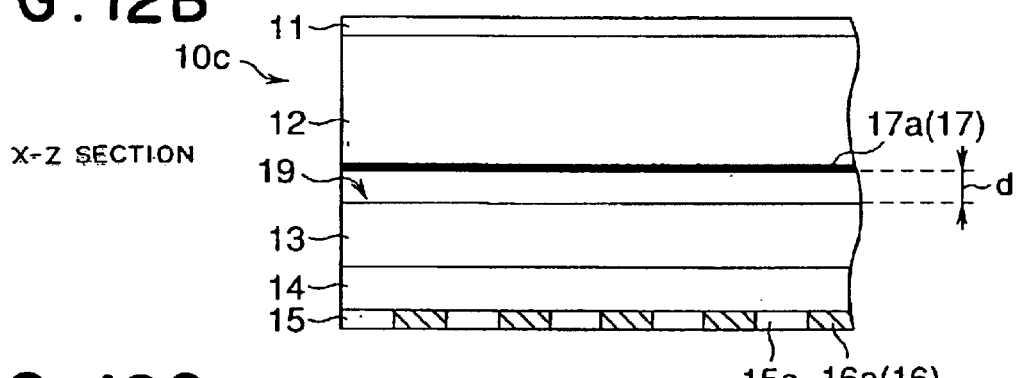
X-Z SECTION
F I G. 12C
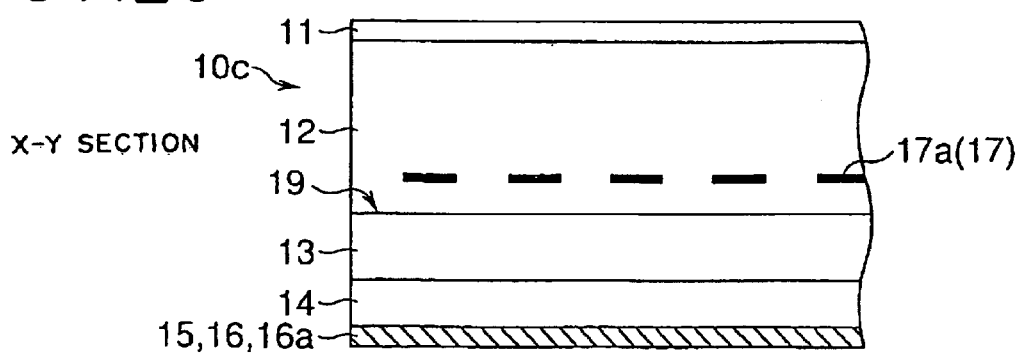
X-Y SECTION

X-Z SECTION

X-Y SECTION

X-Y SECTION

X-Z SECTION

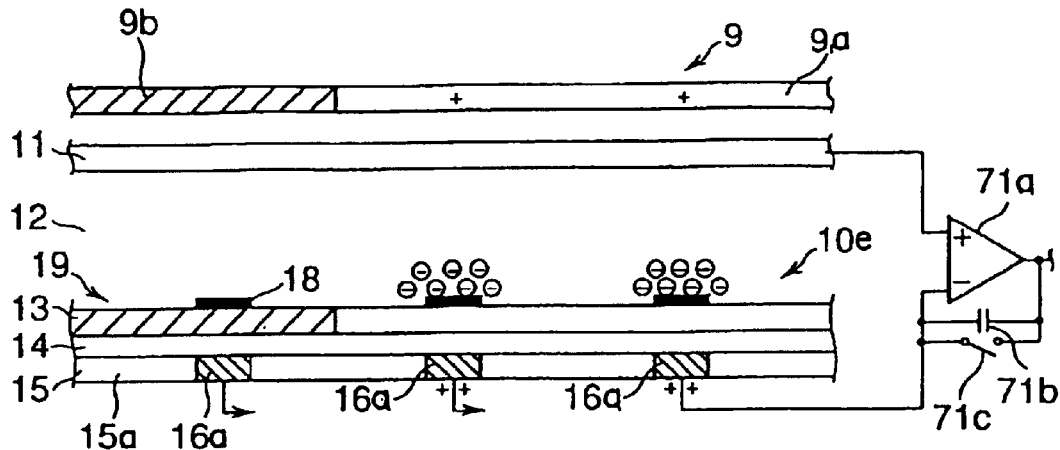
F I G. 16A
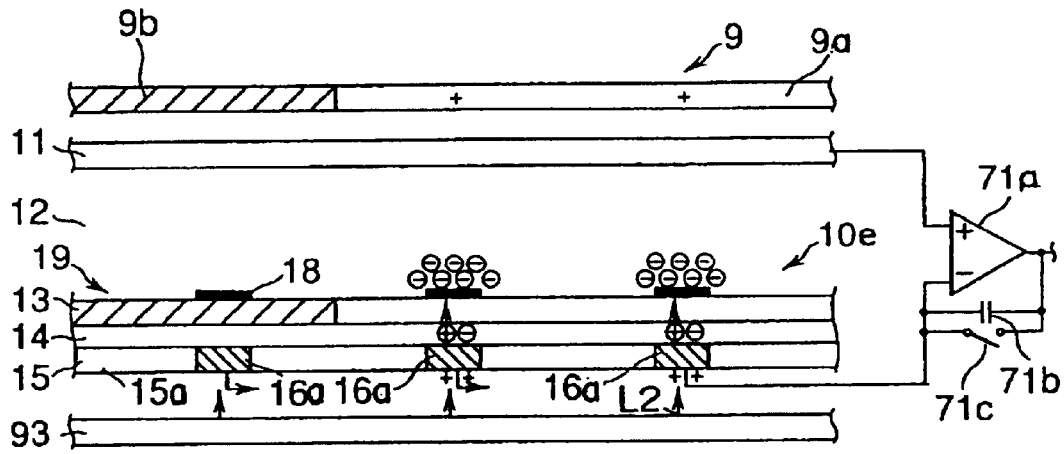
F I G. 16B
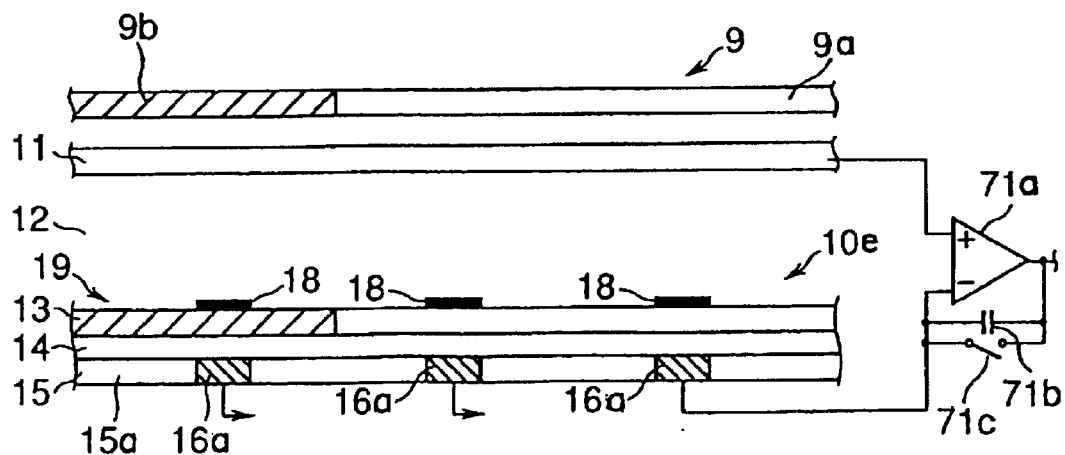
F I G. 16C

FIG. 17B  X-Z SECTION

FIG. 17C  X-Y SECTION

F I G. 18A
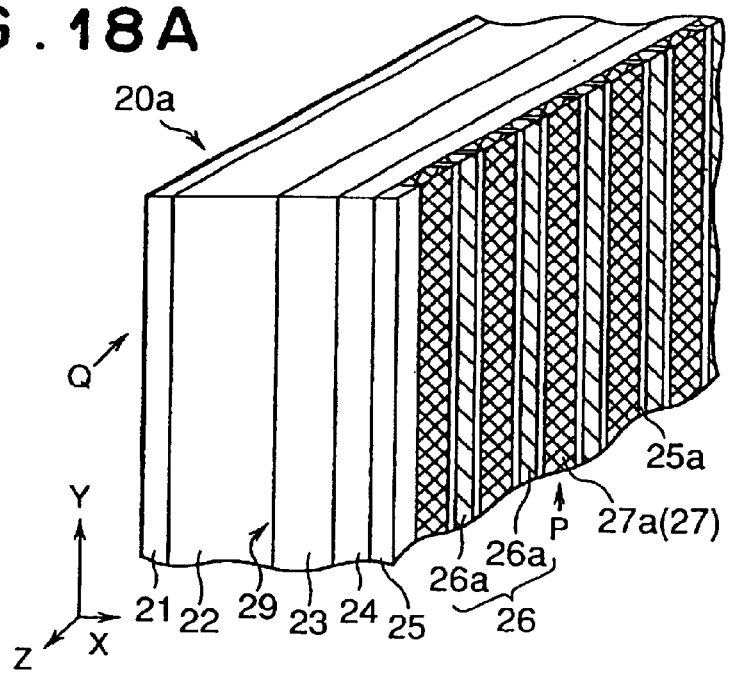
F I G. 18B
X-Z SECTION
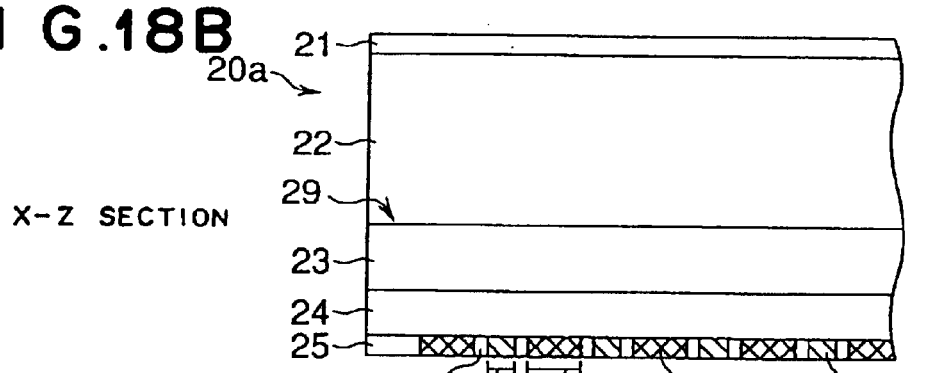
F I G. 18C
X-Y SECTION
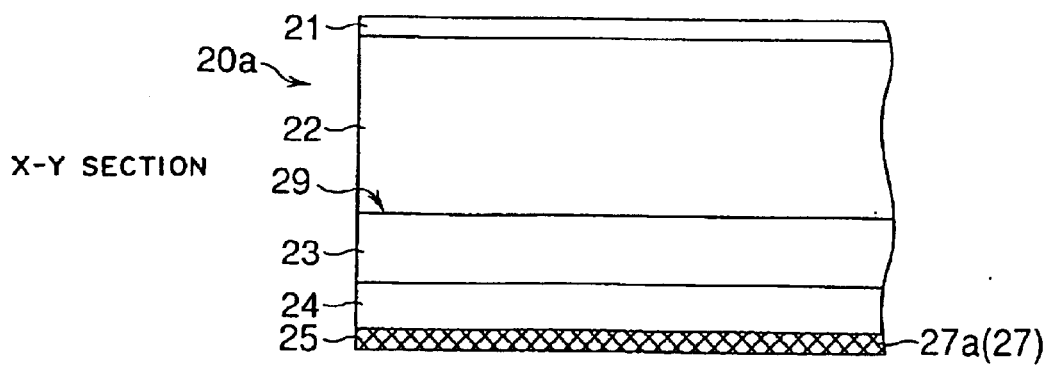

X-Z SECTION

X-Y SECTION

X-Z SECTION

X-Y SECTION

F I G. 22A
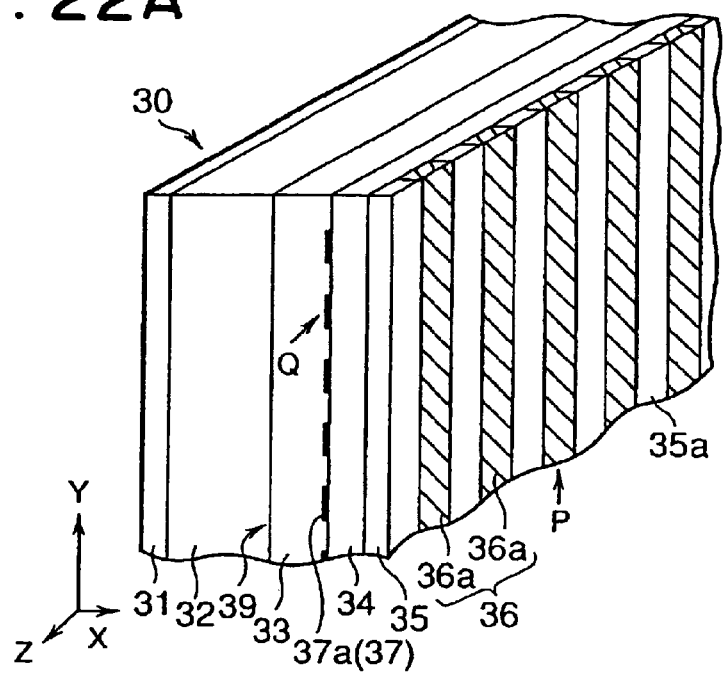
F I G. 22B
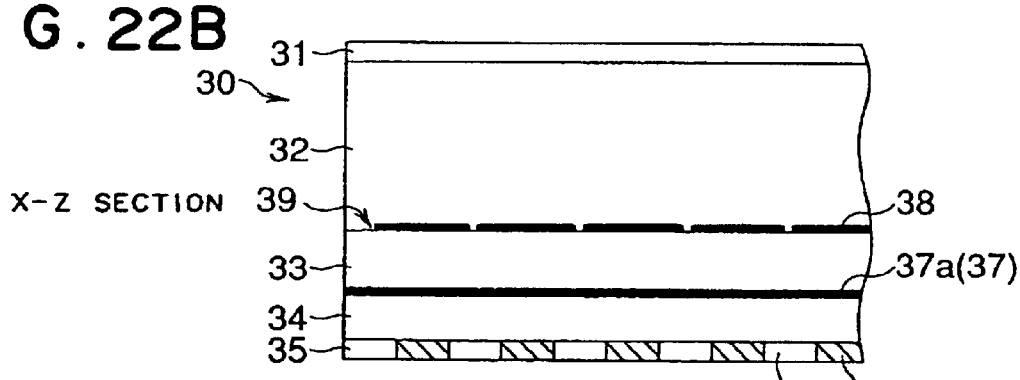
X-Z SECTION
F I G. 22C
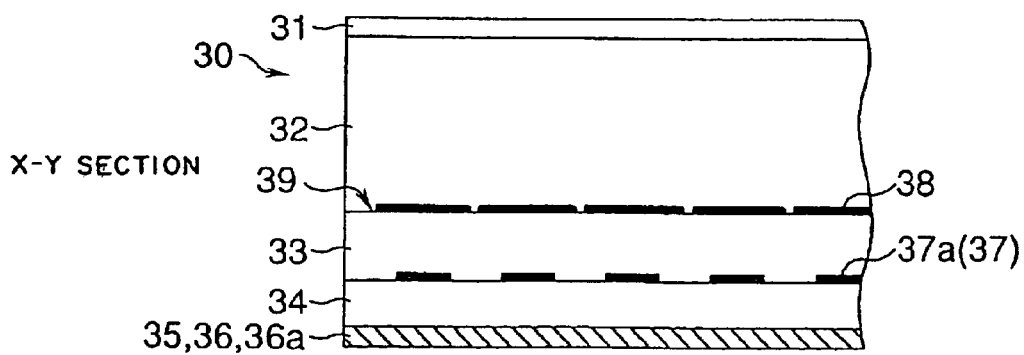
X-Y SECTION

X-Z SECTION

X-Y SECTION

X-Z SECTION

X-Y SECTION

X-Z SECTION

X-Y SECTION

RADIATION SOLID-STATE DETECTORS, AND RADIATION IMAGE RECORD-READING METHOD AND DEVICE USING THE SAME

BACKGROUND OF THE INVENTION

1. Field of the Invention

The present invention relates to a radiation solid-state detector having a charge storing section which stores charges of a quantity corresponding to the dose of the projected radiation as latent image charges, and a method and device for using the detector to record radiation image information as a static latent image or read out the recorded static latent image.

2. Description of the Prior Art

To reduce the dose of exposure of the subject and improve the performance of diagnosis in medical radiation photographing, etc., a method (for example, U.S. Pat. No. 4,535,468, etc.) has been known up to now which uses, as a photosensitive material, a radiation solid-state detector (a static recorder) with a photoconductor, such as a selenium plate, responding to radiation, such as X-ray; projects the X-ray onto the detector, and stores the charges of the quantity corresponding to the dose of the projected radiation in the charge storing section in the detector for recording of radiation image information as a static latent image; and uses a laser beam or a line light source to scan the detector in which the radiation image information has been recorded, for reading out the radiation image information from the detector.

The method according to the above-mentioned U.S. Pat. No. 4,535,468 uses a three-layer structure detector which has an X-ray photoconductive layer, a charge storing layer (also called an intermediate layer or a trap layer) for storing of charges generated in the X-ray photoconductive layer, and a photoconductive layer for reading in this order, and in recording, applies a high voltage across the electrodes provided on both sides of the three layer structure, and projects X-ray to store latent image charges in the charge storing layer, and then short-circuits the electrodes to read out the latent image charges. With this method, the photoconductive layer for reading in the detector is thinner than the X-ray photoconductive layer in order to increase the reading speed for improving the response.

However, with the method according to the above-mentioned U.S. Pat. No. 4,535,468, the photoconductive layer for reading is thinner than the X-ray photoconductive layer, therefore, a problem results that the quantity of the signal charges detected from the outside is small. Further, the charge mobility is low for both electron and hole, and so, the charge storing layer cannot be thin. This is because increasing the charge mobility decreases the response speed, resulting in a residual image being produced. In other words, with this method, it is difficult to make the high speed response in reading compatible with efficient taking out of signal charge.

On the other hand, in Japanese Patent Application No. 10 (1998)-232824 and Japanese Patent Application No. 10 (1998)-271374, the present applicant has proposed a radiation solid-state detector which allows the high speed response in reading to be compatible with the efficient signal charge taking out, a recording device for recording of radiation image information in this detector, and a method and device for reading out the radiation image information from the detector in which the radiation image information has been recorded as a static latent image.

This method as stated in Japanese Patent Application No. 10 (1998)-232824, etc. uses a radiation solid-state detector provided with a photoconductive layer for recording which exhibits conductivity when irradiated with the radiation for recording or the light emitted by excitation on this radiation, a charge transporting layer which acts almost as an insulator for the latent image charges, while acting roughly as a conductor for transported charges having a polarity opposite to that of the latent image charges, and a photoconductive layer for reading which exhibits conductivity when irradiated with the electromagnetic wave for reading in this order. Radiation for recording is projected onto the photoconductive layer for recording in the detector, and by storing the charges of the quantity corresponding to the dose of the projected radiation in the charge storing section formed roughly at the boundary between the photoconductive layer for recording and the charge transporting layer, radiation image information is recorded as a static latent image. By reading out the static latent image, the radiation image information is provided.

The radiation solid-state detector according to the present invention is a radiation solid-state detector which further improves the detector, etc. as stated in the above-mentioned Japanese Patent Application No. 10 (1998)-232824, and Japanese Patent Application No. 10 (1998)-271374, i.e., a radiation solid-state detector which has a charge storing section for storing charges in a quantity corresponding to the dose of radiation which has been projected, and records radiation image information as a static latent image in the charge storing section, wherein a first electrode layer having a permeability to radiation for recording or light emitted by excitation on the radiation, a photoconductive layer for recording which exhibits a conductivity when irradiated with the radiation for recording or the light, a photoconductive layer for reading which exhibits a conductivity when irradiated with an electromagnetic wave for reading, and a second electrode layer having a permeability to the electromagnetic wave for reading are provided in this order, and a first conductive member for outputting an electric signal corresponding to the quantity of the latent image charges stored in the charge storing section formed between the photoconductive layer for recording and the photoconductive layer for reading is provided in the second electrode layer or between the first electrode layer and the second electrode layer.

The first conductive member may have any shape, but, it is preferable that the shape has no effect on the process of latent image forming (transferring and storing of the latent image charges) in recording, or the process of charge-recoupling of the latent image charges with charges opposite in polarity to the latent image charges, i.e., the transported charges. For example, when the first conductive member is provided in the photoconductive layer for recording or on the face of the photoconductive layer for recording which is for the photoconductive layer for reading, the shape is preferably that which will not hinder the latent image charges generated in the photoconductive layer for recording being transferred to the charge storing section. When the first conductive member is provided in the photoconductive layer for reading or in the later-described charge transporting layer or trap layer, the shape is preferably that which will not hinder the transported charges generated in the photoconductive layer for reading being transferred to the charge storing section. For this, it is recommended to take such a measure as providing holes having a desired shape, such as a circle and a square, in correspondence with the pixels, or providing an elongated rectangular hole extending along the direction of the pixel arrangement.

When this first conductive member is disposed in the photoconductive layer for recording, it is preferably permeable to the radiation for recording or the light emitted by excitation at the time of radiation, so that the radiation or the like can sufficiently get into the photoconductive layer for recording, and thus the charge generation process in the photoconductive layer is not affected.

To enhance the response in reading, the smaller the sum of the thickness of the layer forming the charge storing section and that of the photoconductive layer for reading for a given thickness of the photoconductive layer for recording, the better.

The electrode constituting the second electrode layer and/or the first conductive member of the radiation solid-state detector are preferably a stripe electrode comprising a number of linear electrodes.

The term "linear electrode" means an electrode having a long and slender shape as a whole, and so long as it has a long and slender shape, it may of any shape, such as columnar or prismatic, but it is preferable that the linear electrode be particularly a flat plate electrode. To prevent the latent image forming process and the charge-recoupling process from being affected as stated above, such a measure as providing the linear electrode with holes having a desired shape, such as a circle and a square, in correspondence with the pixels, or with an elongated rectangular hole extending along the direction may be taken.

Here, when the electrode constituting the second electrode layer and the first conductive member are a stripe electrode, it is preferable that the linear electrodes of the first conductive member be disposed so that they are opposed to or almost orthogonally intersect the linear electrodes of the electrode constituting the second electrode layer.

The phrase "are disposed so that they are opposed to" means that each linear electrode of the first conductive member is located roughly just above the linear electrode of the electrode constituting the second electrode layer with a specified spacing, and disposed so that they are opposed to each other in the longitudinal direction. The phrase "are disposed so that they almost orthogonally intersect" means that the linear electrodes of the first conductive member almost orthogonally pass over the linear electrodes of the electrode constituting the second electrode layer.

In this case, when the first conductive member is further disposed in the photoconductive layer for recording, the photoconductive layer for reading, or the charge transporting layer, it is recommended that the width of the linear electrode of the first conductive member be 5 to 30% of the pitch for the linear electrodes of the second photoconductive layer to prevent the latent image forming process in recording and the charge-recoupling process from being affected.

When the first conductive member and the electrode constituting the second electrode layer are linear electrodes, the linear electrodes of the first conductive member being disposed in the second electrode layer, it is preferable that each linear electrode of the first conductive member be disposed between linear electrodes of the second electrode layer so that they are in parallel with one another, and be not permeable to the electromagnetic wave for reading to prevent the electromagnetic wave from getting into the photoconductive layer for reading and deteriorating the reading resolution.

Further, with the radiation solid-state detector according to the present invention, it is preferable that a second conductive member for causing the latent image charges to have the same potential be discretely provided in the charge storing section for each pixel for an image represented by the electric signal. Particularly, it is recommended that the second conductive member be provided on the face (boundary) of the photoconductive layer for recording which is for the photoconductive layer for reading.

Here, the phrase "be provided for each pixel" means that preferably one conductive member is provided for each pixel so that the charges around the pixel can be concentrated on the pixel central portion in reading by causing the latent image charges to have the same potential, and does not involve the style in which a number of conductive members are disposed at random for one pixel, so that when reading the charges around the pixel cannot be concentrated on the pixel central portion.

The word "discretely" means that the respective conductive members are disposed in a state isolated from one another, i.e., in the floating state in which they are not connected to one another. When a plurality of conductive members are provided for one pixel, it is preferable that the members for one pixel be electrically connected to one another.

The size of this second conductive member is preferably set at a value approximately equal to the pixel pitch. Or, it may be set at a value smaller than the pixel pitch, say, less than half, and the second conductive member may be disposed in the pixel central portion to concentrate the latent image charges on the pixel central portion. The size of this second conductive member refers to the diameter for a circular conductive member, and the length of each side for a square conductive member. The shape of the conductive member may be any shape, such as a circle and a square.

When a detector with which the electrode constituting the second electrode layer and the first conductive member are a stripe electrode, and the linear electrodes constituting both electrodes are disposed so that they orthogonally intersect each other is used, the electric field is concentrated on the location where both linear electrodes cross. It is therefore preferable that, by disposing the second conductive member in correspondence with the location where both linear electrodes cross, the charge concentration efficiency be increased. In recording, the second conductive members may be left open.

The radiation solid-state detector according to the present invention may have a charge transporting layer, which acts roughly as an insulator for the latent image charges, and roughly as a conductor for charges opposite in polarity to the latent image charges between the photoconductive layer for recording and the photoconductive layer for reading, and the charge transporting layer may form the charge storing section. Alternatively, the radiation solid-state detector may have a trap layer for catching the latent image charges between the photoconductive layer for recording and the photoconductive layer for reading, the trap layer forming the charge storing section.

When the radiation solid-state detector is to have a charge transporting layer or a trap layer, the first conductive member may be provided at the boundary between the photoconductive layer for reading and the trap layer or at the boundary between the photoconductive layer for reading and the charge transporting layer, or in the charge transporting layer or in the trap layer. Further, the second conductive member may be provided at the boundary between the photoconductive layer for reading and the charge transporting layer, or at the boundary between the photoconductive layer for reading and the trap layer.

The radiation image recording method according to the present invention is a radiation image recording method which projects radiation onto the above-stated radiation solid-state detector to store the charges of the quantity corresponding to the dose of the projected radiation in the charge storing section of the radiation solid-state detector as latent image charges for recording of radiation image information as a static latent image in the charge storing section, wherein a control voltage to adjust the electric field formed between both electrode layers by a DC voltage applied across the first electrode layer and the second electrode layer in the radiation solid-state detector is applied to the first conductive member.

The phrase "projects radiation onto the radiation solid-state detector" means that the radiation for recording which carries radiation image information about the subject is directly or indirectly projected onto the detector, and is not limited to the radiation for recording being directly projected onto the detector, meaning that, by projecting the radiation onto a scintillator (a fluorescent body), for example, the light, such as fluorescence, emitted by excitation on the radiation for recording is projected onto the detector.

The term "control voltage" means a voltage of a magnitude with which the first conductive member can have a specified effect on the latent image charge storing process in recording, and it can be set at a voltage of a magnitude which provides roughly the same electric field as that which would be formed if the first conductive member were not provided.

Further, by positively bringing the control voltage close to or away from the potential at the second conductive layer, the region in which latent image charges are formed can be provided with a change. As a result, the signal taking-out efficiency and the reading response speed can be improved.

The control voltage may be either a DC voltage or an AC one. The AC voltage is not limited to the sinusoidal wave, and may be of any waveform, provided that it can improve the signal taking-out efficiency and the reading response speed.

The radiation image reading method is a radiation image reading method which, from the above-stated radiation solid-state detector in which radiation image information has been recorded as a static latent image, reads out the radiation image information, wherein the charges corresponding to the latent image charges stored in the charge storing section of the radiation solid-state detector are read out through the first conductive member to provide an electric signal at a level corresponding to the quantity of the latent image charges.

The phrase "the charges are read out through the first conductive member" means that the charges are read out at least through the first conductive member, and in addition to the current flowing between this first conductive member and the electrode of the second electrode layer, the current flowing between the electrode of the first electrode layer and the electrode of the second electrode layer may also be detected.

The electromagnetic wave for reading may be a continuous wave generated continually or a pulse wave generated in the form of a pulse, but, the pulse wave permits a higher current to be detected, allowing a pixel having a small quantity of latent image charges to be detected as a sufficiently high current, which means, it can substantially improve the S/N ratio, which is advantageous.

However, when the pulse wave is used with a detector with which the electrode constituting the second electrode layer and the first conductive member are a stripe electrode, and the linear electrodes constituting both electrodes are disposed so that they orthogonally intersect each other, the electric field is concentrated at the location where both linear electrodes cross, and the latent image charges are also concentrated at this location. It is therefor preferable that the electromagnetic wave for reading be projected onto the location in the photoconductive layer for reading which corresponds to this crossing location. When a detector with which a second conductive member is provided is used, the latent image charges are stored, being concentrated on the second conductive member, and it is therefore preferable that the electromagnetic wave for reading be projected at least onto the location in the photoconductive layer for reading which corresponds to the location where this second conductive member is provided. In this reading, the second conductive member may be left open.

The radiation image recording device according to the present invention is a radiation image recording device which realizes the above-stated radiation image recording method, comprising:

voltage application means which applies a DC voltage across the first electrode layer and the second electrode layer in the radiation solid-state detector, and control voltage application means for applying, to the first conductive member, a control voltage to adjust the electric field formed between both electrode layers by a DC voltage applied by the voltage application means.

The radiation image recording device according to the present invention is a radiation image recording device which realizes the above-stated radiation image recording method, comprising image signal acquisition means which, by reading out the charges corresponding to the latent image charges stored in the charge storing section of the radiation solid-state detector through the first conductive member, provides an electric signal at a level corresponding to the quantity of the latent image charges.

When a detector with which the electrode of the second electrode layer and the electrode of the first conductive member are a stripe electrode, and the linear electrodes of the first conductive member are disposed so that they almost orthogonally intersect the linear electrodes of the second electrode layer is used, it is preferable that, by carrying out switchover so that only the linear electrode corresponding to the scanning position in scanning with the reading light is connected to the first electrode layer and the linear electrodes of the second electrode layer, the distributed capacitance which does not contribute to the signal reading be reduced.

The basic detector to which the present invention is to be applied may be any detector, provided that it is a detector with which electrodes are stacked so that they sandwich the photoconductive layer for recording and the photoconductive layer for reading, and it is preferable that the present invention be applied, particularly, to a detector (a static recorder) which has been proposed by the present applicant in the above-mentioned Japanese Patent Application No. 10 (1998)-232824, and Japanese Patent Application No. 10 (1998)-271374.

With the radiation solid-state detector according to the present invention, the first conductive member for outputting an electric signal at a level corresponding to the quantity of the latent image charges is provided between the second electrode layer and the first electrode layer, and therefore another capacitor can be formed between the charge storing section which is formed between the photoconductive layer for recording and the photoconductive layer for reading, and the first conductive member. The transported charges having a polarity opposite to that of the latent image charges stored in the charge storing section by recording can also be provided for the first conductive member by charge-recoupling in reading. The quantity of the transported charges distributed to the capacitor formed between the electrode of the second electrode layer and the charge storing section, through the photoconductive layer for reading, can be reduced to below that when this first conductive member is not provided. The quantity of the signal charges which can be taken out from the detector to the outside can be increased to improve the reading efficiency.

With the radiation image information reading method and device according to the present invention, the signal charges representing radiation image information are read out from the detector according to the present invention in which the radiation image information has been recorded, through the first conductive member, for providing an image signal at a level corresponding to the quantity of the latent image charges stored in the charge storing section. Therefore, more charges can be read out from the detector, which allows the reading efficiency to be increased, a larger signal to be obtained, and the S/N ratio for an image to be improved.

Providing the first conductive member will have practically no great effect on the thickness of the photoconductive layer for recording or the photoconductive layer for reading, which means that the response in reading will not be adversely affected, and as stated in Japanese Patent Application No. 10 (1998)-232824 and Japanese Patent Application No. 10 (1998)-271374, for example, by decreasing the sum of the thickness of the charge transporting layer and that of the photoconductive layer for reading to below the thickness of the photoconductive layer for recording, the response in reading can be enhanced. In other words, according to the present invention, the high speed response in reading can be maintained, while the reading efficiency can be increased to a level still higher than that obtained when a conventional detector is used.

Further, with the radiation image information reading method and device according to the present invention, a control voltage to adjust the electric field formed between the first electrode layer and the second electrode layer is applied to the first conductive member, which allows the signal taking-out efficiency and the reading response speed to be improved.

If the detector is that with which the second conductive member for causing the latent image charges to have the same potential is provided discretely in the charge storing section for each pixel for an image represented by the electrical signal, all the latent image charges for each pixel stored on the second conductive member can be caused to have the same potential, which allows the reading efficiency to be increased to a level higher than that obtained when the second conductive member is not provided. This is because the latent image charges are held at the same potential in the range of the second conductive member, therefore, the latent image charges around the pixel, which are generally difficult to read out, can be moved to the central portion of the second conductive member, i.e., the pixel central portion, as the reading progresses, so long as they are in the range of the second conductive member, which means that the latent image charges can be sufficiently discharged.

In addition, the pixel can be formed at the fixed location where the second conductive member is disposed, which allows the structure noise to be compensated for.

Further, if the size of the second conductive member is set at a value smaller than the pixel pitch, and disposed in the central portion of the pixel, the shape of the electric field formed in reading can be such that the electric field is attracted toward the second conductive member, therefore, the latent image charges can be stored, being concentrated on the pixel central portion, which means the sharpness of the image can be improved.

If the second conductive member is provided, the latent image charges can be stored with no charge transporting layer or trap layer, which means, device formation can be performed more easily.

When the detector having a charge transporting layer or trap layer is provided with the second conductive member, the charge storing effect of such a layer can also be utilized. In other words, if the size of the second conductive member is set at a value smaller than the pixel pitch, and such a layer is not provided, a problem arises that the charges which have not been caught by the second conductive member cannot be stored as latent images, resulting in the quantity of the stored charges being decreased, although they contribute to the improvement in sharpness. Contrarily, when such a layer is provided, the charges are caused to be stored as latent image charges, so that the sharpness can be improved without the quantity of the stored charges being reduced.

SUMMARY OF THE INVENTION

As with a detector, and a recording device and reading device as proposed in the above-mentioned Japanese Patent Application No. 10 (1998)-232824, etc. by the present applicant, the present invention is intended to provide compatibility between the high speed response in reading and the efficient signal charge taking out, and to offer a radiation solid-state detector which makes it possible to provide still higher performance than that of the device as stated in Japanese Patent Application No. 10 (1998)-232824, a method and device for recording of radiation image information in this detector, and a method and device for reading out the radiation image information from the detector in which the radiation image information has been recorded.

BRIEF DESCRIPTION OF THE DRAWINGS

FIG. 7A and FIG. 7B being for a case where no microplate is provided, and FIG. 7C and FIG. 7D being for a case where a microplate is provided, FIG. 8A to FIG. 8G are diagrams illustrating the static latent image record-reading method using the above-stated radiation solid-state detector by means of a capacitor model, FIG. 9A being for a case where no sub-electrode is provided, and FIG. 9B being for a case where a sub-electrode is provided, FIG. 12A is a perspective side view of a radiation solid-state detector according to a fourth embodiment of the present invention; FIG. 12B is an X-Z sectional drawing at the portion shown by arrow-Q; and FIG. 12C is an X-Y sectional drawing at the portion shown by arrow-P, FIG. 16A to FIG. 16C are drawings illustrating the method for reading out a static latent image recorded in the radiation solid-state detector of the sixth embodiment, FIG. 17B is an X-Z sectional drawing at the portion shown by arrow-Q; and FIG. 17C is an X-Y sectional drawing at the portion shown by arrow-P, FIG. 18A is a perspective side view of a radiation solid-state detector according to an eighth embodiment of the present invention; FIG. 18B is an X-Z sectional drawing at the portion shown by arrow-Q; and FIG. 18C is an X-Y sectional drawing at the portion shown by arrow-P, FIG. 22A is a perspective side view of a radiation solid-state detector according to an eleventh embodiment of the present invention; FIG. 22B is an X-Z sectional drawing at the portion shown by arrow-Q; and FIG. 22C is an X-Y sectional drawing at the portion shown by arrow-P.

DESCRIPTION OF THE PREFERRED EMBODIMENTS

Hereinbelow, embodiments of the present invention will be described with reference to the drawings.

Figure 1A:
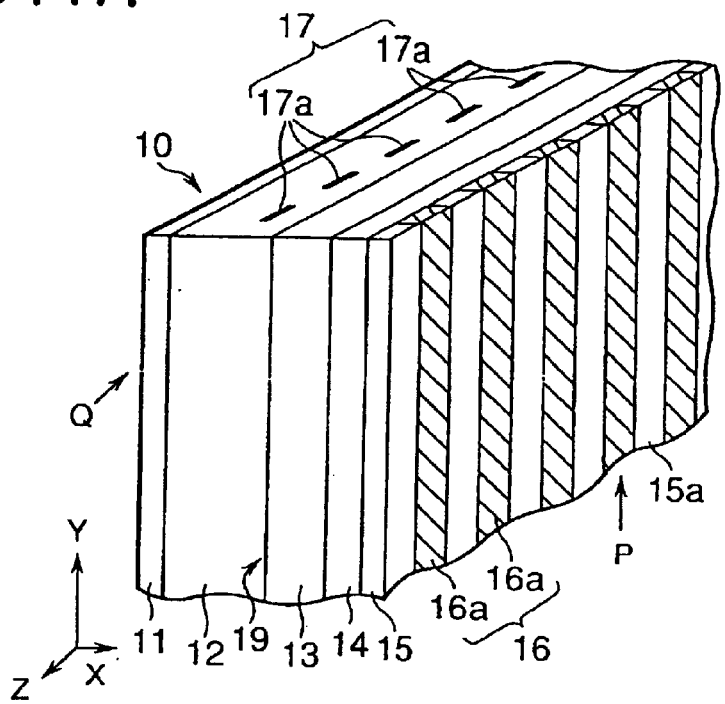
FIG. 1A is a perspective side view of a radiation solid-state detector according to a first embodiment of the present invention.
Figure 1B:
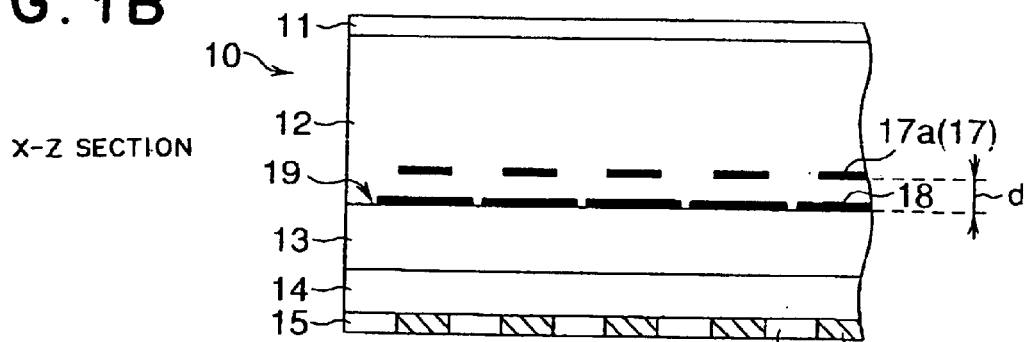
FIG. 1B is an X-Z sectional drawing at the portion shown by arrow-Q.
Figure 1C:
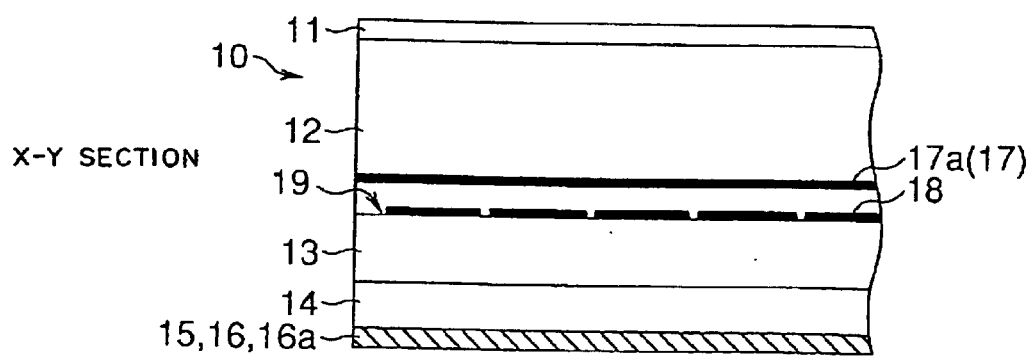
FIG. 1C is an X-Y sectional drawing at the portion shown by arrow-P.

FIG. 1A, FIG. 1B, and FIG. 1C are drawings showing the schematic configuration of the radiation solid-state detector according to a first embodiment of the present invention, FIG. 1A being a perspective side view of a radiation solid-state detector, FIG. 1B being an X-Z sectional drawing at the portion shown by arrow-Q; and FIG. 1C being an X-Y sectional drawing at the portion shown by arrow-P. With this detector 10, the static recording device as shown in FIG. 12, which is stated in the above-mentioned Japanese Patent Application No. 10 (1998)-232824, is further provided with a sub-electrode as a first conductive member and microplates as a second conductive member, and has a first electrode layer 11 having a permeability to the radiation for recording, L1 (such as X-ray, hereafter called the recording light), a photoconductive layer for recording, 12, which exhibits a conductivity when irradiated with the recording light L1 which has penetrated through this electrode layer 11, a charge transporting layer 13 which acts almost as an insulator for the latent image charges, (for example, a negative charge), while acting roughly as a conductor for transported charges having a polarity opposite to that of the latent image charges, (on the above example, a positive charge), a photoconductive layer for reading, 14, which exhibits a conductivity when irradiated with the electromagnetic wave for reading (hereafter called the reading light), L2, and a second electrode layer 15 having a permeability to the reading light L2 stacked together in this order.

As the substance for the photoconductive layer for recording, 12, a photoconductive substance which has, as its main constituant, at least one of the substances, such as amorphous selenium (a-Se), lead oxide (II) and lead iodide (II), such as PbO and $PbI_2$, $Bi_{12}(Ge, Si)O_{20}$, and $Bi_2I_3$/organic polymer nano-composite, is suitable.

As the substance for the charge transporting layer 13, organic compounds, such as poly-n-vinyl carbazole (PVK), N,N-phenyl-N,N-bis(3-methyl phenyl)-4,4'-diamine (TPD), and dyscotic liquid crystal, a dispersed system of TPD in polymer (polycarbonate, polystyrene, or PVK), and semiconductor substances, such as a-Se doped with Cl at 10 to 200 ppm, are suitable, because the greater the difference between the mobility of the negative charge, for example, stored in the electrode layer 11, and that of the positive charge, which is opposite in polarity to it, (for example, $10^2$ or over, preferably $10^3$ or over), the better. Particularly, organic compounds (such as PVK, TPD, and a dyscotic liquid crystal) are preferable because they have immunity to light, and because the dielectric constant is generally small, the capacitance of the charge transporting layer 13 and that of the photoconductive layer for reading, 14, are decreased, resulting in an increased efficiency of signal taking out when reading. "Having immunity to light" means that they exhibit practically no conductivity when irradiated with the recording light L1 or the reading light L2.

As the substance for the photoconductive layer for reading, 14, a photoconductive substance which has, as its main constituent, at least one of the substances, such as a-Se, Se—Te, Se—As—Te, metal-free phthalocyanine, Mgpc (Magnesium Phthalocyanine), VoPc (phase II of Vanadyl Phthalocyanine), CuPc (Cupper Phthalocyanine), is suitable.

The thickness of the photoconductive layer for recording, 12, is preferably 50 μm to 1000 μm so that it can sufficiently absorb the recording light L1, and in this example, approx. 500 μm is specified. The sum of the thickness of the charge transporting layer 13 and that of the photoconductive layer for reading, 14, is preferably half or less of the thickness of the photoconductive layer for recording, 12, and because the smaller the sum, the better the response in reading, it is preferably, for example, 1/10 or less, and further, 1/20 or less.

As the electrode layers 11 and 15, a nesa film, for example, which is a conductive substance applied to a transparent glass plate, is suitable.

The electrode of the second electrode layer 15 is formed as a stripe electrode 16 with which a number of elements (linear electrodes) 16a are arranged in the form of stripes. In an area 15a between elements 16a, a high-polymer material, such as polyethylene in which some quantity of carbon black or other pigment is dispersed is filled, and the area 15a has a shading property with respect to the reading light L2.

At the boundary between the photoconductive layer for recording, 12, and the charge transporting layer 13, i.e., in the charge storing section 19, a number of discrete square microplates 18 are disposed just above the elements 16a of the stripe electrode 16, each being spaced apart from the adjacent microplates 18. The length of the side of each microplate 18 is specified to be a dimension approximately equal to the arrangement pitch for the elements 16a, i.e., the smallest pixel pitch which can be resolved. The locations where the microplates 18 are disposed provide the locations of the pixels on the detector.

The microplates 18 can be produced from an extremely thin film of a single metal, such as gold, silver, aluminum, copper, chromium, titanium, and platinum, or an alloy, such as indium oxide, which is deposited on the dielectric layer by using vacuum vapor deposition or chemical deposition, for example. The microplates 18 can be deposited as a continuous layer, and the continuous layer is then etched to form a plurality of individual discrete microplates having a size approximately equal to the smallest pixel pitch which can be resolved. Such discrete microplates can be produced by using laser ablation, photoetching, or other light microfabrication technology.

In the location close to the charge transporting layer 13 in the photoconductive layer for recording, 12, a sub-electrode 17 with which a number of elements 17a are arranged in the form of stripes is provided. This sub-electrode 17 is a conductive member for outputting an electric signal at a level corresponding to the quantity of the latent image charges stored in the charge storing section 19 formed roughly at the boundary between the photoconductive layer for recording, 12, and the charge transporting layer 13. Each element 17a of the sub-electrode 17 is located just above the element 16a of the stripe electrode 16, both being disposed so that they are opposed to each other. The sub-electrode 17 is required only to be conductive, and can be produced from a single metal, such as gold, silver, chromium, and platinum, or an alloy, such as indium oxide.

The distance "d" between the sub-electrode 17 and the charge transporting layer 13 varies depending upon the thickness of the photoconductive layer for recording, 12, and when the thickness of the photoconductive layer for recording, 12 is approx. 500 μm as specified in this example, the distance "d" is specified to be 1 μm to 100 μm (1/500 to 1/5 of the thickness).

FIG. 2A to FIG. 2D are schematic drawings giving examples of shapes of each element 17a of the sub-electrode 17 and illustrating the arrangement relationship among the element 17a, the microplate 18, and the element 16a.

Figure 2A:
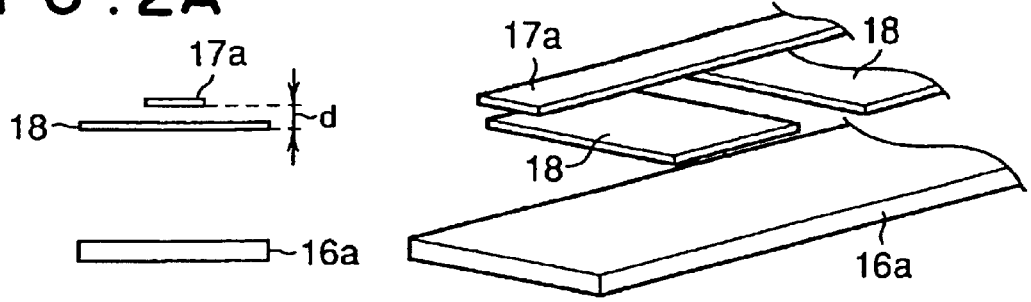
FIG. 2A to FIG. 2D are schematic drawings giving examples of shapes of the element of a sub-electrode and illustrating the arrangement relationship among the element of the sub-electrode, the microplates, and the element of the stripe electrode.

The element 17a as shown in FIG. 2A is a long and slender flat plate electrode, having no holes provided. The width of the element 17a is smaller than that of the element 16a, being specified to be within the range of 5 to 30% of the pitch for the elements 16a. This allows the latent image charges generated in the photoconductive layer for recording to be easily passed by the side of the element 17a when they are transferred to the charge storing section.

Figure 2B:
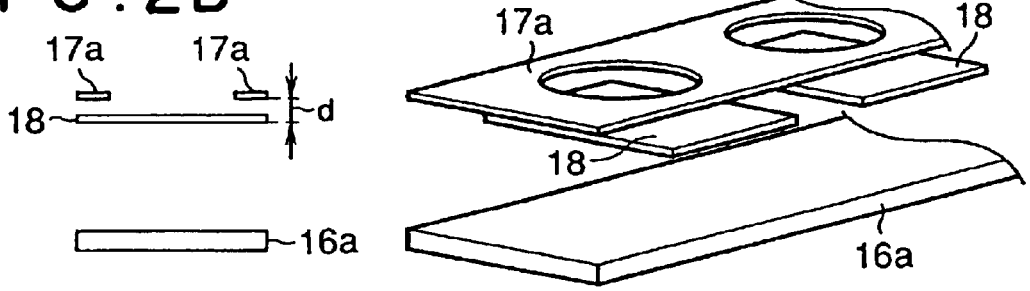

The element 17a as shown in FIG. 2B is a long and slender flat plate electrode, having a number of round holes provided so that they are disposed at locations corresponding to the pixels for the longitudinal direction. The width of the element 17a is approximately equal to that of the element 16a. The latent image charges generated in the photoconductive layer for recording can reach the microplates 18 provided in the charge storing section 19 through the round holes.

Figure 2C:
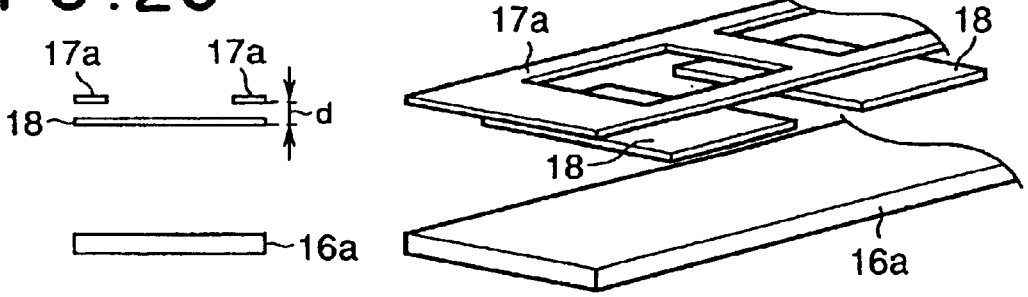

The element 17a as shown in FIG. 2C is a long and slender flat plate electrode, having a number of square holes provided so that they are disposed at locations corresponding to the pixels for the longitudinal direction. The width of the element 17a is approximately equal to that of the element 16a. The latent image charges generated in the photoconductive layer for recording can reach the microplates 18 provided in the charge storing section 19 through the square holes.

Figure 2D:
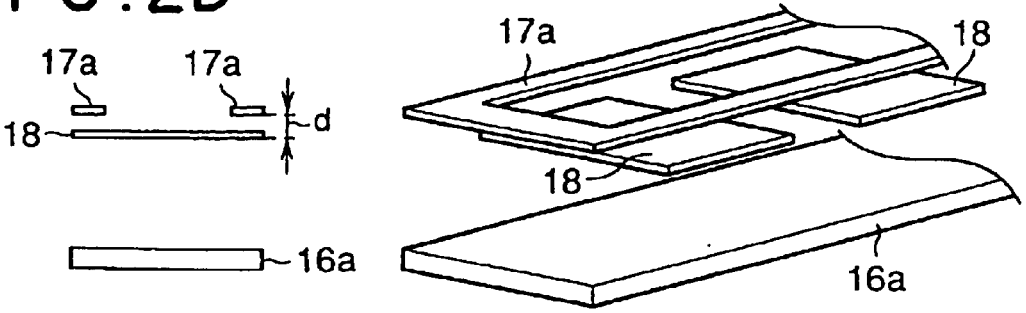

The element 17a as shown in FIG. 2D is a long and slender flat plate electrode, having one elongated rectangular hole, the opposite ends thereof being connected to each other. The width of the element 17a is approximately equal to that of the element 16a. The latent image charges generated in the photoconductive layer for recording can reach the microplates 18 provided in the charge storing section 19 through the elongated rectangular hole.

By thus making the element 17a narrower than the element 16a, or providing a hole(s) having a specified shape for the element 17a along its longitudinal direction, the possibility of the element 17a hindering the transfer of the latent image charges and having an adverse effect on the latent image forming process can be eliminated.

Figure 3A:
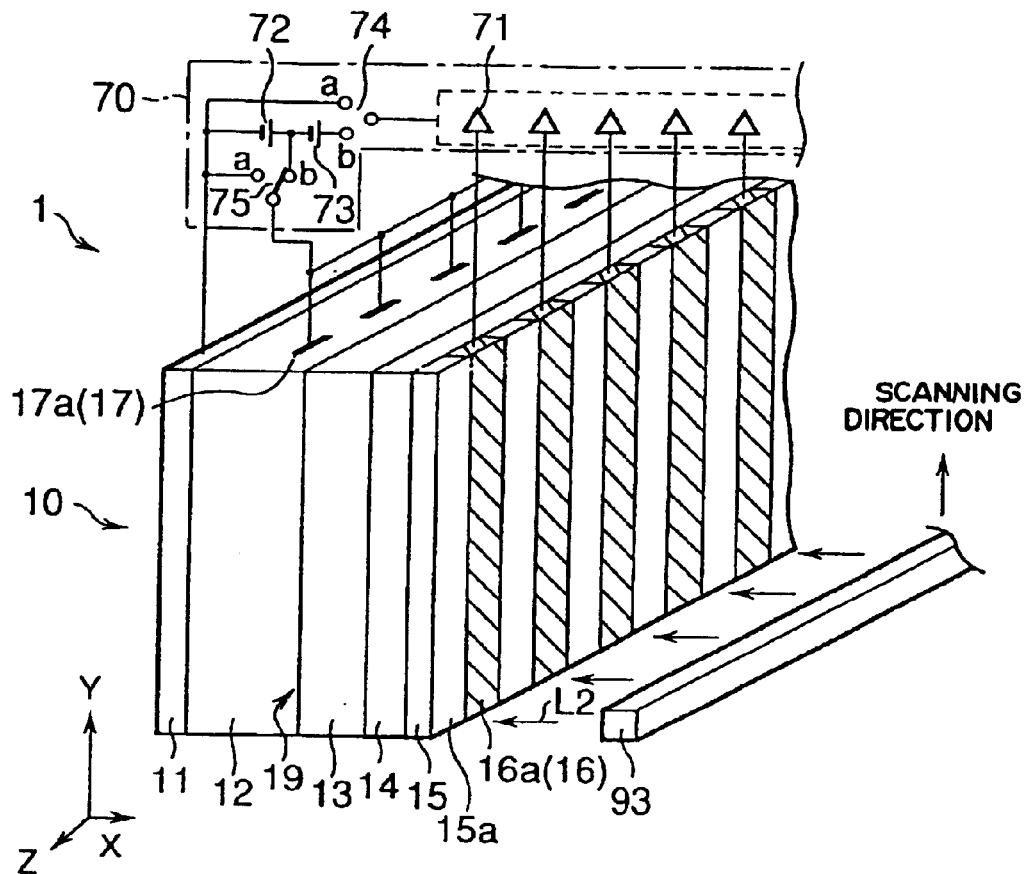
FIG. 3A and FIG. 3B are schematic configuration diagrams for a record-reading device using the above-stated radiation solid state detector.
Figure 3B:
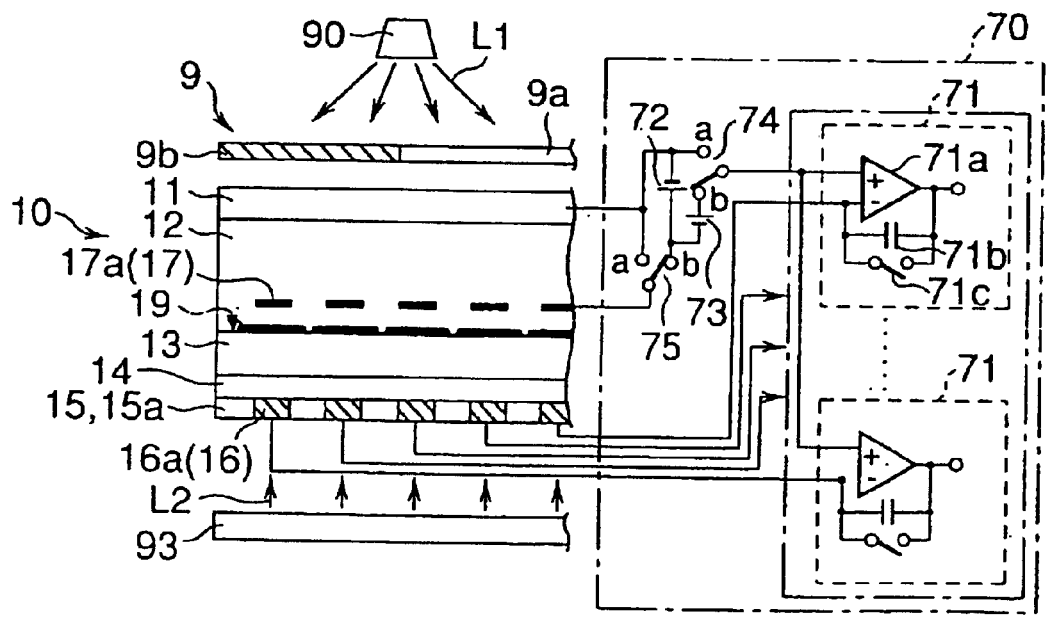

FIG. 3A and FIG. 3B are schematic configuration diagrams for a record-reading device 1 using the radiation solid state detector 10 in which a radiation image information recording device is integrated with a radiation image information reading device, FIG. 3A being a diagram shown with a perspective side view of the detector 10, and FIG. 3B being a diagram of a current detection circuit 70 shown in detail with an X-Z sectional view of the detector 10.

This record-reading device 1 comprises the detector 10, the current detection circuit 70 as image signal acquisition means, recording light projecting means 90, and reading light L1 projecting means 93.

Above the electrode layer 11, a subject 9 is disposed, and the subject 9 has a portion 9a which has permeability to the recording light L1 and a shutting-off (shading) portion 9b which has no permeability to the recording light L1. The recording light projecting means 90 uniformly projects the recording light L1 on the subject 9.

The reading light projecting means 93 linearly projects the almost uniform reading light L2 onto the elements 16a of the stripe electrode 16 roughly at right angles to them, scanning the elements 16a along the longitudinal direction (in the direction of arrow in FIG. 3A). This scanning by means of the reading light L2 corresponds to the vertical scanning. In this scanning, continuous light may be projected or pulsed light may be projected.

The current detection circuit 70 reads out the charges corresponding to the latent image charges stored in the charge storing section 19 through the sub-electrode 17 to provide an image signal at a level corresponding to the quantity of the latent image charges, having a number of current detection amplifiers 71 connected to the elements 16a of the stripe electrode 16. The current detection amplifiers 71 detect the charges of the quantity corresponding to that of the latent image charges as a current through each element 17a, each comprising an operational amplifier 71a, an integrating capacitor 71b, and a switch 71c. The electrode layer 11 in the detector 10 is connected to the respective one inputs 74a and 75a of the switches 74 and 75, and to the negative electrode of the power supply 72. The positive electrode of the power supply 72 is connected to the negative electrode of the power supply 73 and the other input 75b of the switch 75. The positive electrode of the power supply 73 is connected to the other input 74b of the switch 74. The non-inverting input terminal (+) of each operational amplifier 71a is commonly connected to the output of the switch 74, and the inverting input terminal (−) is individually connected to the element 16a. The output of the switch 75 is commonly connected to each element 17a.

In recording, the switches 74 and 75 are both connected to the respective "b" terminals, and voltage is applied through the imaginary short circuit in the operational amplifiers across the electrode layer 11 and the stripe electrode 16, the specified supply by the power supplies 72 and 73. The power supply 73 also functions as control voltage applying means, and in recording, a DC voltage as a control voltage is applied to the sub-electrode 17 from this power supply 73. This supply voltage is set at such a voltage that causes the electric field formed across the electrode layer 11 and the stripe electrode 16, particularly, the potential gradient in the photoconductive layer for recording, 12, to be roughly the same as that which would be formed when no sub-electrode 17 is provided, so that the latent image charges can be stably stored in the charge storing section 19. The sub-electrode 17 may be left open without any control voltage being applied to it in recording. Further, by bringing the voltage at the sub-electrode 17 close to or away from the potential at the second conductive layer, i.e., the stripe electrode 16, the control voltage may be positively set so that a desired electric field is formed.

On the other hand, in reading, the switches 74 and 75 are both connected to the respective "a" terminals, and the linear reading light is projected onto the stripe electrode 16, the respective current detection amplifiers 71 concurrently detecting the current flowing through the respective elements 16a for the respective elements 16a connected to them. The configurations of the current detection circuit 70 and the current detection amplifier 71 are not limited to those in this example, and a variety of configurations may be used (for example, refer to Japanese Patent Application No. 10 (1998)-232824 and Japanese Patent Application No. 10 (1998)-271374).

In this example, the circuitry is configured so that a DC voltage is applied to the sub-electrode 17 from this power supply 73 in recording, but, a special power supply for the sub-electrode 17 may be provided independently of the power supply for applying the DC voltage across the electrode layer 11 and the stripe electrode 16 so that the control voltage having a desired waveform is applied to adjust the electric field in recording to a more preferable one.

Figure 4A:
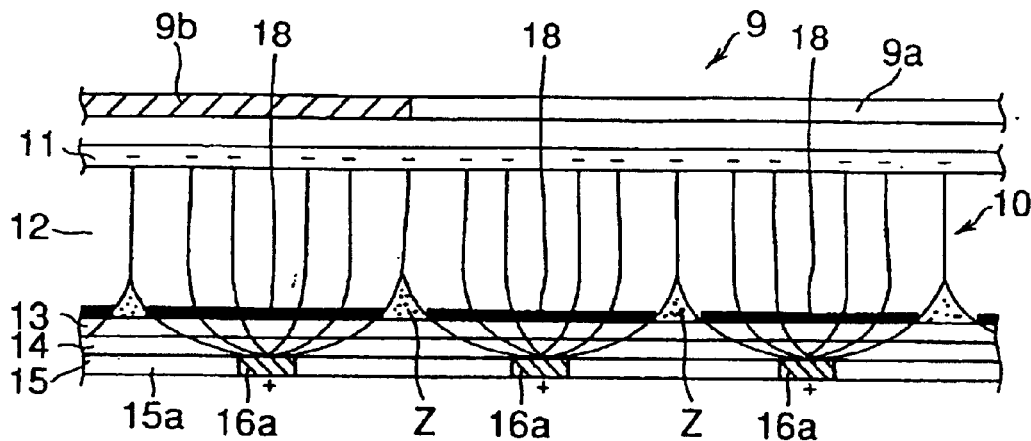
FIG. 4A to FIG. 4C are drawings illustrating the method for recording a static latent image in the above-stated radiation solid-state detector.
Figure 4B:
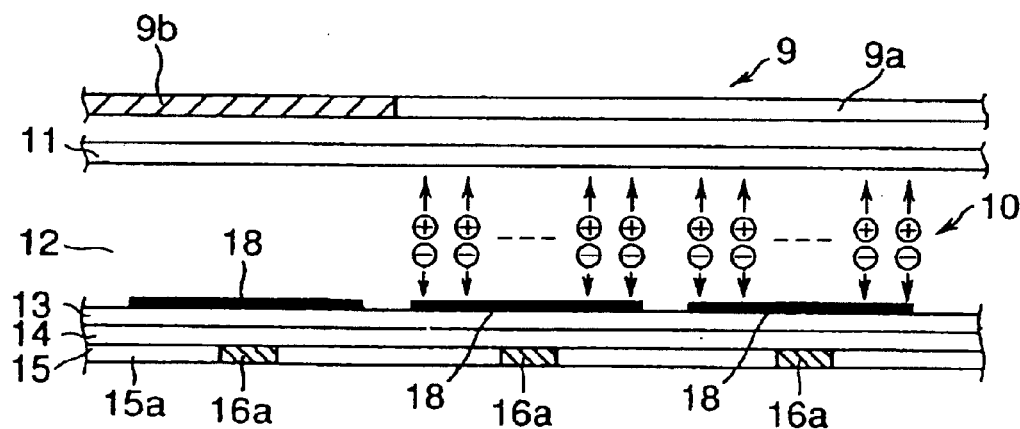
Figure 4C:
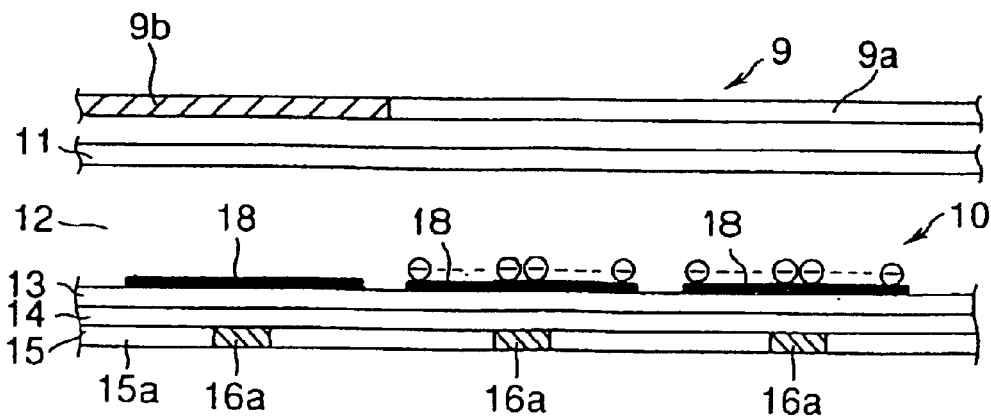

Hereinbelow, the method for recording image information as a static latent image in the detector 10 and reading out the recorded static latent image with the record-reading device 1 configured as above will be described. First, the process of recording a static latent image will be described with reference to the electric charge model as shown in FIG. 4A to FIG. 4c. The negative charges (−) and the positive charges (+) generated in the photoconductive layer 12 by the recording light L1 are expressed by circling the signs "−" and "+" on the drawing. The elements 17a of the sub-electrode 17 are not expressed.

When, with the record-reading device 1 configured as above, a static latent image is recorded in the detector 10, the switches 74 and 75 are both turned to the respective "b" terminals to apply the DC voltage across the electrode layer 11 and the stripe electrode 16 in order to electrify both. At this time, a control voltage to allow the latent image charges to be stably stored in the charge storing section 19 is applied to the sub-electrode 17 as stated above. In this way, a nearly U-shaped electric field is formed across the electrode layer 11 and the stripe electrode 16, and in most of the photoconductive layer for recording, 12, a roughly parallel electric field is provided, but at the boundary between the photoconductive layer for recording, 12, and the charge transporting layer 13, i.e., in the charge storing section 19, there are portions where there is no electric field. Thus, an electric field with which such a U-shaped electric field is continued along the longitudinal direction of the elements 16a is formed (FIG. 4A).

Next, the radiation is projected on the subject 9, and the recording light L1 carrying the radiation image information for the subject 9 which has penetrated through the permeating portion 9a of the subject 9 is projected on the detector 10. Then, pairs of charges, positive and negative, are generated in the photoconductive layer for recording, 12, in the detector 10, and the negative charges of the pairs are transferred to the charge storing section 19 along the above-stated electric field (FIG. 4B). At this time, because the specified DC voltage is applied to the sub-electrode 17 from the power supply 75 so that the potential gradient in the photoconductive layer for recording, 12, is not disarranged, the negative charges are transferred to the charge storing section 19, being passed by the side of or through the hole in the elements 17a of the sub-electrode 17 without being caught by the sub-electrode 17. In other words, any charges generated in the photoconductive layer for recording, 12, are transferred as if the sub-electrode were not provided.

In the charge storing section 19, microplates 18 are provided, and the negative charges which have been transferred in the photoconductive layer for recording, 12, are caught and stopped by the microplates 18, being stored as latent image charges on the microplates 18 in this charge storing section 19 (FIG. 4C).

On the other hand, the positive charges generated in the photoconductive layer for recording, 12, are transferred at high speed to the electrode layer 11, and charge-recoupled with the negative charges injected from the power supplies 72 and 73 at the boundary between the electrode layer 11 and the photoconductive layer for recording, 12, thus being cancelled. The recording light L1 will not permeate the shading portion 9b of the subject 9, and therefore no change will be caused in the area of the detector 10 under the shading portion 9b (FIG. 4B and FIG. 4C).

Thus, by projecting the recording light L1 on the subject 9, the charges corresponding to the subject image can be stored in the charge storing section 19, which is the boundary between the photoconductive layer for recording, 12, and the charge transporting layer 13. The quantity of the stored latent image charges (negative) is roughly in proportion to the dose of radiation which has been penetrated through the subject 9 and projected onto the detector 10. Therefore, these latent image charges carry the static latent image, and the static latent image is recorded in the detector 10. Because the latent image charges are stored on the microplates 18, the locations where the latent image charges are to be stored can be established for both the horizontal scanning and the vertical scanning, and for both scanning directions, a pixel is formed in the respective established locations.

Figure 5A:
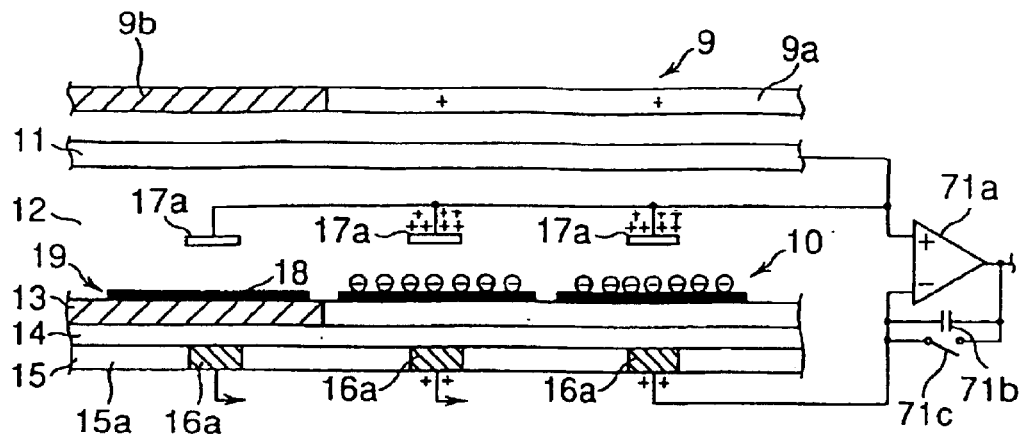
FIG. 5A to FIG. 5C are drawings illustrating the method for reading out a static latent image recorded in the above-stated radiation solid-state detector.
Figure 5B:
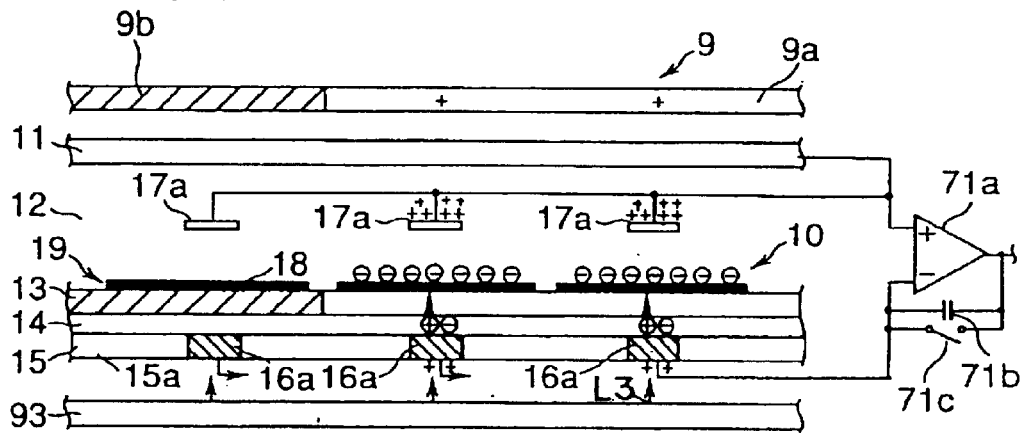
Figure 5C:
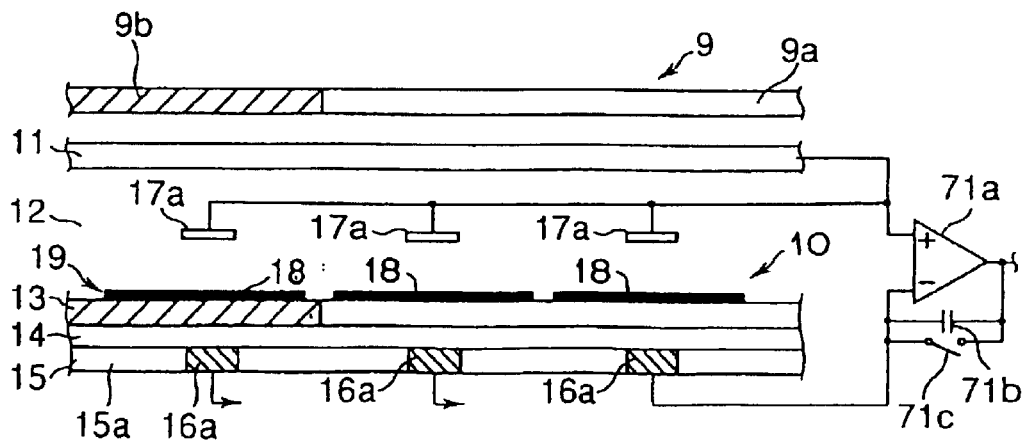

Next, the process of reading out a static latent image will be described with reference to the electric charge model as shown in FIG. 5 A to FIG. 5C. As is the case with the recording process, the negative charges (−) and the positive charges (+) generated in the photoconductive layer for reading, 14, by the reading light L2 are expressed by circling the signs "−" and "+" on the drawing.

In reading out the static latent image from the detector 10, the switches 74 and 75 are both turned to the respective "a" terminals to connect the electrode layer 11 in the detector 10 in which the static latent image has been recorded as described above, to the sub-electrode 17, and through the imaginary short circuit in the operational amplifier, also to the stripe electrode 16, to electrify these to the same potential in order to rearrange the charges (FIG. 5A). Next, by moving the reading light projecting means 93 along the longitudinal direction of the elements 16a, i.e., carrying out the vertical scanning, the entire surface of the detector 10 is scanned with the linear reading light L2. This scanning with the reading light L2 generates pairs of charges, positive and negative, in the locations in the photoconductive layer 14 which correspond to the vertical scanning positions and where the reading light L2 is projected (FIG. 5B). When the detrimental effect of the dark current component is to be relatively reduced by projecting the reading light L2 in a pulsating manner, it is preferable to synchronize the scanning so that the reading light L2 is projected where the microplates 18 are provided.

Between the charge storing section 19 and the stripe electrode 16, an extremely strong electric field is formed by the stored charges (negative), depending upon the thickness. The charge transporting layer 13 acts as a conductor for positive charges, which means that, the positive charges generated in the photoconductive layer 14 are rapidly transferred in the charge transporting layer 13, being attracted by the latent image charges in the charge storing section 19, and are charge-recoupled with the latent image charges in the charge storing section 19, so as to be cancelled (FIG. 5C). On the other hand, the negative charges generated in the photoconductive layer 14 are cancelled by being charge-recoupled with the positive charges in the electrode layer 11, the stripe electrode 16, and the sub-electrode 17(FIG. 5C).

Figure 6:
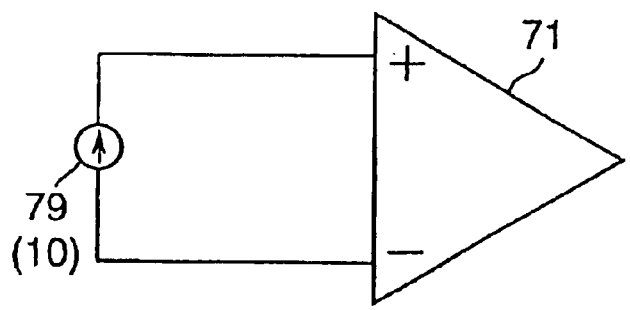
FIG. 6 is an equivalent circuit diagram in which the discharge current flowing in the detector in reading is expressed as a current source.

The photoconductive layer 14 is scanned with the reading light L2 having a sufficient luminous power, and the latent image charges stored in the charge storing section 19 of the detector 10 are all cancelled by the charge-recoupling for complete discharge. The latent image charges stored in the charge storing section 19 of the detector 10 being cancelled means that a discharge current flows in the detector 10, resulting from the transfer of the charges, and can be regarded as a short-circuit being caused across the stripe electrode 16 and the charge storing section 19. This condition can be expressed with an equivalent circuit as shown in FIG. 6, which uses a source of current, 79, which is in proportion to the discharge current flowing in the detector 10, depending upon the quantity of the stored charges. This current flowing in the detector 10 in reading corresponds to the latent image charges, i.e., the static latent image, so, by detecting this current by means of the current detection amplifiers 71, the static latent image can be read out, i.e., the image signal representing the static latent image can be acquired.

Because an extremely strong electric field is formed between the charge storing section 19 and the stripe electrode 16, the latent image charges can be cancelled at an extremely high speed, which means that the response in reading out a static latent image is carried out at an extremely high speed. The smaller the sum of the thickness of the photoconductive layer for reading, 14, and that of the charge transporting layer 13 for a given thickness of the photoconductive layer for recording, 12, the stronger the electric field formed in reading, and the more rapid the transfer of the charges, therefore, the higher the reading speed.

Here, the charge storing section 19 is provided with the microplates 18, which means that, in the reading process (the charge-recoupling process and the discharging process), the latent image charges around the respective microplates 18 can be attracted toward the central portion of them, which allows the latent image charges to be discharged more sufficiently, resulting in the quantity of the unread charges being minimized. FIG. 7A to FIG. 7D are drawings illustrating the effect of the microplate 18 provided in the reading process, with FIG. 7A and FIG. 7B being for a case where no microplates 18 are provided, and FIG. 7c and FIG. 7D being for a case where microplates 18 are provided.

Figure 7A:
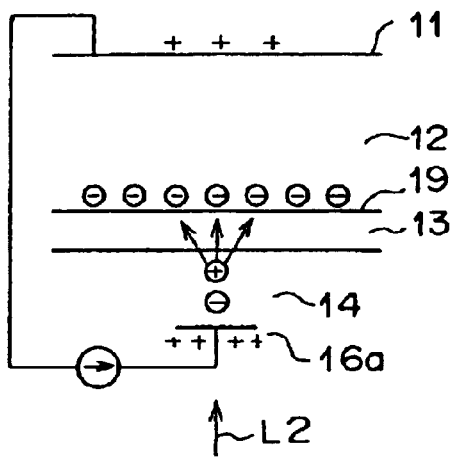
FIG. 7A to FIG. 7D are drawings illustrating the effect of the microplate.
Figure 7B:
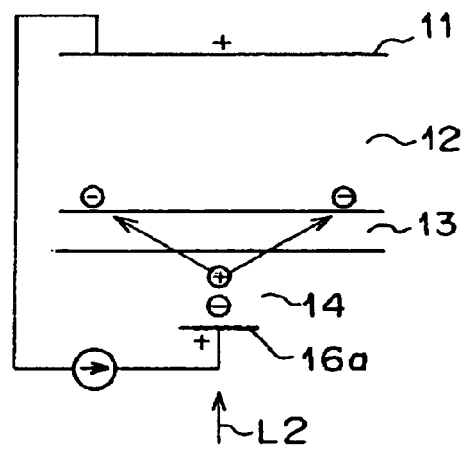
Figure 7C:
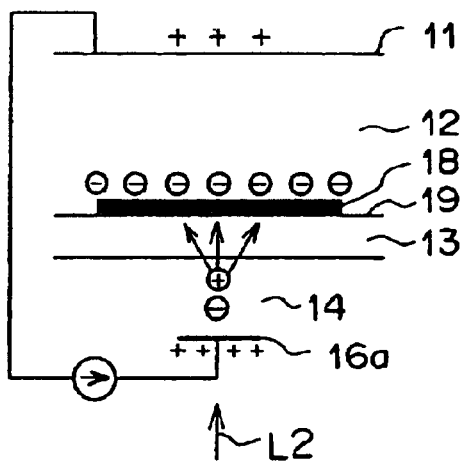

As shown in FIG. 7A to FIG. 7D, the reading light L2 is projected onto the photoconductive layer for reading, 14, through the element 16a to generate pairs of charges, positive and negative, in the photoconductive layer for reading, 14. In recoupling of the positive ones of the generated charges with latent image charges in the charge storing section 19, recoupling is sequentially performed, starting from the charge in the location opposed to and the nearest to the element 16a. In other words, at the beginning of reading, the negative charge in the pixel central portion is cancelled by charge-recoupling, and then the charges outside that portion are sequentially charge-recoupled (FIG. 7A). When no microplate 18 is provided, the latent image charges in the charge storing section 19 are not caused to have the same potential, and are left in the respective stored locations. Therefore, as the reading progresses, charges in locations more distant from the element 16$a$ must be read, the difficulty in reading being increased, and in the final process, charges may be left unread (FIG. 7B).

Figure 7D:
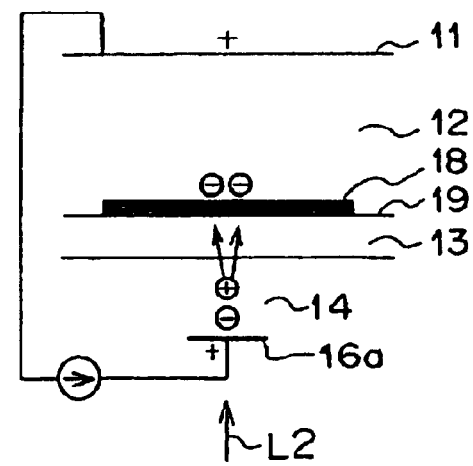

On the other hand, when a microplate 18 is provided, the negative charge in the pixel central portion is cancelled by charge-recoupling at the beginning of reading, and then the charges outside that portion are sequentially charge-recoupled (FIG. 7C), but the charges stored on the microplate 18 are always held at the same potential. Consequently, as the reading progresses, the latent image charges are gradually moved to the central portion of the microplate 18, i.e., the pixel central portion, which means that, even in the final process, charge-recoupling with a latent image charge is performed in the pixel central portion, which provides the smallest distance between the microplate 18 and the second conductive layer 15, i.e., the stripe electrode 16, and as a result the highest discharge efficiency, and the discharge can be easily continued with no charges being left unread (FIG. 7D).

The above-described static latent image recording process and static latent image reading process will be described in greater detail by using a capacitor model as shown in FIG. 8A to FIG. 8G. In these drawings FIG. 8A to FIG. 8G, the system is imaginarily divided into the sub-system for the permeating portion 9$a$ and that for the shading portion 9$b$ of the subject 9 to express both processes as electrical equivalent circuit diagrams using a capacitor model. Between the electrode layer 11 and the charge storing section 19 which sandwich the photoconductive layer for recording, 12, a capacitor $C_{*a}$ is formed. Between the charge storing section 19 and the stripe electrode 16 (the elements 16$a$) which sandwich the charge transporting layer 13 and the photoconductive layer for reading, 14, a capacitor $C_{*b}$ is formed. Between the sub-electrode 17 (the element 17$a$) and the charge storing section 19 which sandwich a part of the photoconductive layer for recording, 12, a capacitor $C_{*c}$ is formed.

Across the capacitor $C_{*a}$, an optical switch $SW_{*a}$ (not shown) corresponding to the photoconductive layer for recording, 12, which exhibits a conductivity with the recording light L1 is formed, and across the capacitor $C_{*b}$, an optical switch $SW_{*b}$ (not shown) corresponding to the photoconductive layer for reading, 14, which exhibits a conductivity with the reading light L2 is formed.

In the recording process, the DC voltage is first applied to the detector 10 from the power supplies 72 and 73, which results in the distribution capacitors $C_{*a}$, $C_{*b}$, and $C_{*c}$ being electrified (FIG. 8A).

With the sub-system for the permeating portion 9$a$, projection of the recording light L1 turns the optical switch $SW_{*a}$ on, and only the capacitor $C_{*b}$ is charged through the resistor $R_{*a}$ corresponding to the quantity of light (FIG. 8B). This is the static latent image recording process, meaning that the static latent image has been recorded as the latent image charges in the capacitor $C_{*b}$. The quantity of the latent image charges corresponds to the quantity of light of the recording light L1.

Next, after removing the power supplies 72 and 73, the electrode layer 11 side of the capacitor $C_{*a}$ is connected to the sub-electrode side 17 of the capacitor $C_{*c}$, and the sub-electrode side 17 of the capacitor $C_{*c}$ is connected to the stripe electrode 16 side of the capacitor $C_{*b}$ for rearranging the charges (FIG. 8C). The sum of the quantities of the positive charges distributed to the capacitors, which are opposite in polarity to the latent image charges, is equal to the quantity of the latent image charges, and the quantities of the positive charges distributed are proportional to the capacitance values of the respective capacitors. Thereafter, by projecting the reading light L2, the optical switch $SW_{*b}$ is turned on, and the charges stored in the capacitors $C_{*a}$, $C_{*b}$, and $C_{*c}$ are discharged through the resistor $R_{*b}$ corresponding to the quantity of light (FIG. 8D). The equivalent circuit as shown in FIG. 6 is expressed as a circuit for detecting the discharge current resulting from the charges which are discharged to the outside of the detector 10 at this time.

On the other hand, with the sub-system for the shading portion 9$b$, the recording light L1 will not turn the optical switch $SW_{*a}$, and give no change to any of the capacitors $C_{*a}$, $C_{*b}$, and $C_{*c}$ (FIG. 8E). Therefore, connecting the capacitors $C_{*a}$, $C_{*b}$, and $C_{*c}$ to one another in recording causes all of the capacitors $C_{*a}$, $C_{*b}$, and $C_{*c}$ to be brought into the discharged state (FIG. 8F). Consequently, when the reading light L2 is projected under such condition, no charges will be discharged from any of the capacitors $C_{*a}$, $C_{*b}$, and $C_{*c}$ (FIG. 8G).

Figure 9A:
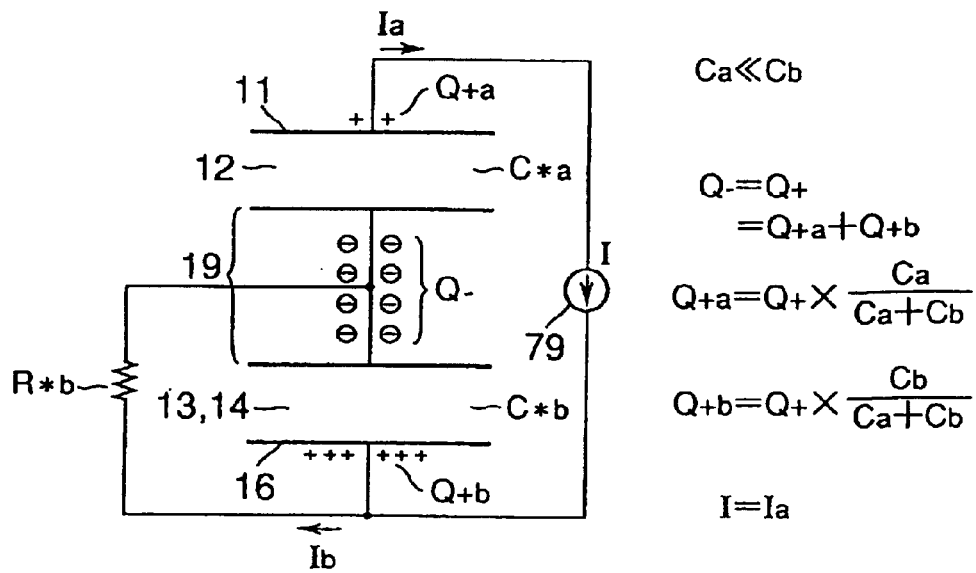
FIG. 9A and FIG. 9B are diagrams illustrating the quantity of the charges for a signal outputted from the radiation solid-state detector by means of a capacitor model.

Next, the magnitude of the current flowing when the charges stored in the capacitors $C_{*a}$, $C_{*b}$, and $C_{*c}$ are discharged will be discussed. First, to simplify the description, a capacitor model as shown in FIG. 9A, which is not provided with the sub-electrode 17 and comprises only the capacitors $C_{*a}$ and $C_{*b}$ is used. As stated above, the sum $Q_+$ of the quantities $Q_{+a}$ and $Q_{+b}$ of the positive charges distributed to the capacitors $C_{*a}$ and $C_{*b}$ in the charge rearrangement is equal to the quantity $Q_-$ of the latent image charges, and the quantities $Q_{+a}$ and $Q_{+b}$ of the positive charges distributed are proportional to the capacitance values $C_a$ and $C_b$ of the respective capacitors. The sum of the thickness of the photoconductive layer for reading, 14, and that of the charge transporting layer 13, is smaller than the thickness of the photoconductive layer for recording, 12, which means, assuming that there is no significant difference in dielectric constant between layers, that the capacitance value $C_b$ of the capacitor $C_{*b}$ is higher than the capacitance value $C_a$ of the capacitor $C_{*a}$. Consequently, the quantity $Q_{+b}$ of the positive charges induced on the stripe electrode 16 side of the capacitor $C_{*b}$ is larger than the quantity $Q_{+a}$ of the positive charges induced on the electrode layer 11 side of the capacitor $C_{*a}$. The above description can be represented by the following equations.

$$Q_- = Q_+ = Q_{+a} + Q_{+b}$$

$$Q_{+a} = Q_+ \times C_a / (C_a + C_b)$$

$$Q_{+b} = Q_+ \times C_b / (C_a + C_b)$$

The magnitudes of the currents flowing when the charges stored in the capacitors $C_{*a}$ and $C_{*b}$ are discharged are in proportion to the quantities $Q_{+a}$ and $Q_{+b}$, and therefore, the current $I_b$ flowing out from the capacitor $C_{*b}$ is higher than the current $I_a$ flowing out from the capacitor $C_{*a}$.

Here, because the charge storing section 19 is not directly provided with an electrode for taking out a signal, the current $I_b$ flowing out from the capacitor $C_{*b}$ provides the internal current flowing in the detector 10 through the resistor $R_{*b}$ created when the optical switch $SW_{*b}$ is turned on in reading, and cannot be detected between the charge storing section 19 and the stripe electrode 17, and the positive charges distributed to the capacitor $C_{*b}$ in the sub-system for the permeating portion 9a cannot be taken out as signal charges to the outside of the detector 10. In other words, of the quantity $Q_+$ of the positive charges which have been charge-rearranged in correspondence with the latent image charges (negative) stored in the charge storing section 19 of the detector 10, the quantity of the charges which can be taken out to the outside, i.e., the quantity Q of the signal charges representing the radiation image information is equal to the quantity $Q_{+a}$ of the positive charges distributed to the capacitor $C_{*a}$, and the current I flowing out from the detector 10 to the outside is equal to the current $I_a$ flowing out from the capacitor $C_{*a}$.

In other words, the positive charges generated in the photoconductive layer for reading, 14, by the reading light L2 are cancelled by being charge-recoupled with the latent image charges in the charge storing section 19, while, of the negative charges generated in the photoconductive layer for reading, 14, those for the quantity $Q_{+b}$ of the positive charges rearranged on the elements 16a are cancelled by being charge-recoupled on the elements 16a, and the current at this time provides only the internal current in the detector 10. Also, the negative charges in a quantity equal to the remaining $Q_{+a}$ are induced on the elements 16a, and the current flowing in charge-recoupling of these negative charges with the positive charges in the electrode layer 11 is taken out as the current I flowing out from the detector 10 to the outside.

As described above, the sum of the thickness of the photoconductive layer for reading, 14, and that of the charge transporting layer 13, is set at a value smaller than the thickness of the photoconductive layer for recording, 12, to improve the response speed in reading, and thus the capacitance value $C_b$ of the capacitor $C_{*b}$ is higher than the capacitance value $C_a$ of the capacitor $C_{*a}$. This means that the quantity Q of the charges which can be taken out for a given quantity $Q_-$ of the recorded latent image charges is decreased, and the signal current I ($=I_a$) is correspondingly reduced, resulting in the reading efficiency being lowered.

Figure 9B:
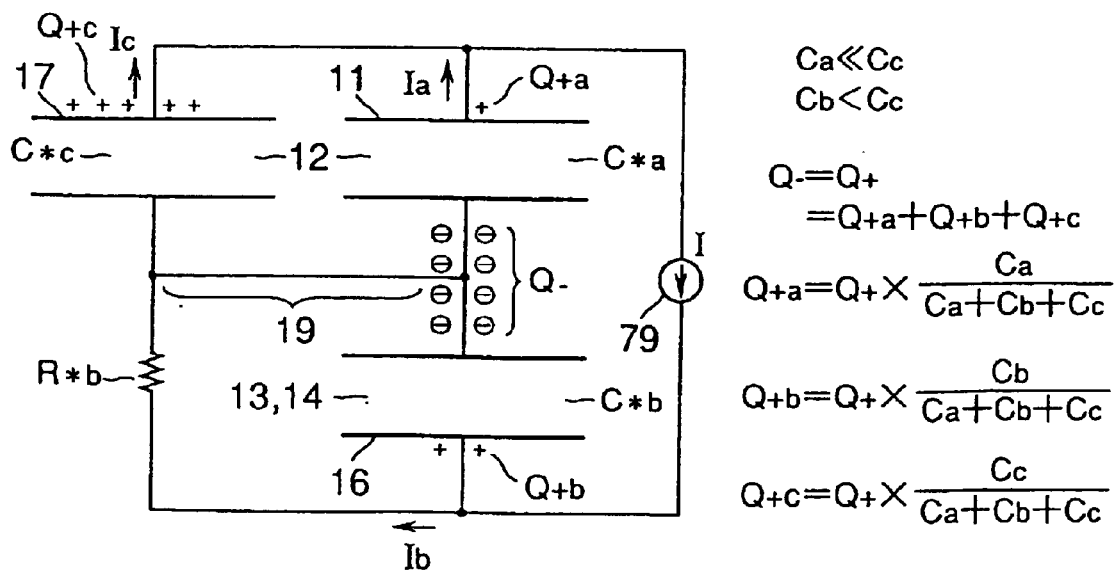

On the other hand, with the radiation solid-state detector 10 according to the present invention, the sub-electrode 17 is provided, which additionally forms a capacitor $C_{*c}$. Hereafter, the capacitor model as shown in FIG. 9B will be described. As stated above, the sum $Q_+$ of the quantities $Q_{+a}$, $Q^{+b}$, and $Q_{+c}$ of the positive charges distributed to the capacitors $C_{*a}$, $C_{*b}$, and $C_{*c}$ in the charge rearrangement is equal to the quantity $Q_-$ of the latent image charges, and the quantities $Q_{+a}$, $Q_{+b}$, and $Q_{+c}$ of the positive charges distributed are proportional to the capacitance values $C_a$, $C_b$, and $C_c$ of the respective capacitors. This description can be represented by the following equations.

$$Q_-=Q_+={}_{+a}+Q_{+b}+Q_{+c}$$

$$Q_{+a}=Q_+\times C_a/(C_a+C_b+C_c)$$

$$Q_{+b}+Q_+\times C_b/(C_a+C_b+C_a)$$

$$Q_{+c}=Q_+\times C_c/(C_a+C_b+C_c)$$

Incidentally, consideration of the capacitance values of the capacitors $C_{*a}$, $C_{*b}$, and $C_{*c}$ points out that the sub-electrode 17 is provided in the photoconductive layer for recording, 12, in the location separated by the distance "d" from the charge storing section 19, which is the boundary between the photoconductive layer for recording, 12, and the charge transporting layer 13, and on the other hand, the electrode layer 11 is provided at a location much farther than the distance "d". This means that the capacitance value $C_c$ of the capacitor $C_{*c}$, which is formed between the sub-electrode 17 and the charge storing section 19 through the photoconductive layer for recording, 12, is sufficiently higher than the capacitance value $C_a$ of the capacitor $C_{*a}$, which is formed between the electrode layer 11 and the charge storing section 19 through the photoconductive layer for recording, 12. On the other hand, providing the sub-electrode 17 as stated above will have practically no great effect on the capacitance value $C_b$ of the capacitor $C_{*b}$, which is formed between the stripe electrode 16 and the charge storing section 19 through the photoconductive layer for reading, 14, and the charge transporting layer 13. As a result, the quantity $Q_{+b}$ of the positive charges distributed to the capacitor $C_{*b}$ in the charge rearrangement can be reduced to below that when the sub-electrode 17 is not provided. In addition, by setting the distance "d" from the electrode layer 11 at an appropriate value, the capacitance value $C_c$ of the capacitor $C_{*c}$ can be increased to more than the capacitance value $C_b$ of the capacitor $C_{*b}$ to further reduce the quantity $Q_{+b}$ of the positive charges distributed to the capacitor $C_{*b}$.

As with the case where the sub-electrode 17 is not provided, the positive charges distributed to the capacitor $C_{*b}$ cannot be taken out as signal charges to the outside of the detector 10, and so, the quantity Q of the signal charges which can be taken out to the outside is equal to the sum of the quantities $Q_{+a}$ and $Q_{+c}$ of the positive charges, distributed to the capacitors $C_{*a}$ and $C_{*c}$, i.e., $(Q_{+a}+Q_{+c})$, and the current I flowing out from the detector 10 to the outside is equal to the sum $(I_a+I_c)$ of the current $I_a$ flowing out from the capacitor $C_{*a}$ and the current $I_c$ flowing out from the capacitor $C_{*c}$. As stated above, because the quantity $Q_{+b}$ of the positive charges distributed to the capacitor $C_{*b}$ can be reduced to below that when the sub-electrode is not provided, the current I ($=I_a+I_c$) flowing out from the detector 10 to the outside can be increased to greater than that when the sub-electrode is not provided.

As a result of this, notwithstanding that the sum of the thickness of the charge transporting layer 13 and that of the photoconductive layer for reading, 14, is smaller than the thickness of the photoconductive layer for recording, 12, providing the sub-electrode 17 can increase the quantity Q of the signal charges or the signal current I which can be taken out from the detector 10 to the outside, i.e., the reading efficiency, resulting in the S/N ratio for the reproduced image being improved.

Because the capacitance value $C_c$ of the capacitor $C_{*c}$ can be increased to a value sufficiently higher than the capacitance value $C_a$ of the capacitor $C_{*a}$, the quantity $Q_{+c}$ of the positive charges distributed to the capacitor $C_{*c}$ can be increased to a quantity sufficiently larger than the quantity $Q_{+a}$ of the positive charges distributed to the capacitor $C_{*a}$ and the current $I_c$ flowing out from the capacitor $C_{*c}$ can be increased to a current sufficiently higher than the current $I_a$ flowing out from the capacitor $C_{*a}$. Consequently, if only the current $I_c$ flowing out from the capacitor $C_{*c}$ is detected through the sub-electrode 17, it can be expected that a sufficiently large image signal is taken out.

With the current detection circuit 70, the current I flowing out from the detector 10 is detected concurrently for the respective elements 16a. In other words, the integrating capacitor 71b for the current detection amplifier 71 connected to the respective elements 16a is charged by the current I, the charges corresponding to the quantity of the current flowing are stored in the integrating capacitor 71b, and the voltage across the integrating capacitor 71b is changed. This change in voltage is in proportion to the quantity Q_ of the latent image charges for each pixel which had been stored in the detector 10. Therefore, by turning the switch 71c on between pixels during scanning to discharge the charges stored in the integrating capacitor 71b, the change in voltage corresponding to the quantity of the latent image charges for each pixel is sequentially observed across the integrating capacitor 71b, and by detecting this change in voltage, the image signal representing the static latent image can be obtained. In other words, the radiation image information can be read out.

When each element 17a of the sub-electrode 17 is located just above the element 16a of the stripe electrode 16, both being disposed so that they are opposed to each other, the charges are rearranged concurrently for all the elements 17a for the sake of reading out the image signal concurrently for the respective elements 16a of the stripe electrode 16. In this case, in the pixel locations other than those where reading is carried out with the reading light L2 in vertical scanning, the element 16a is opposed to the element 17a, resulting in the distributed capacitance which does not contribute to the signal reading being increased, and this is disadvantageous from the viewpoint of steady noise. However, because the element 17a is not switched over, no switching noise is produced.

Figure 10A:
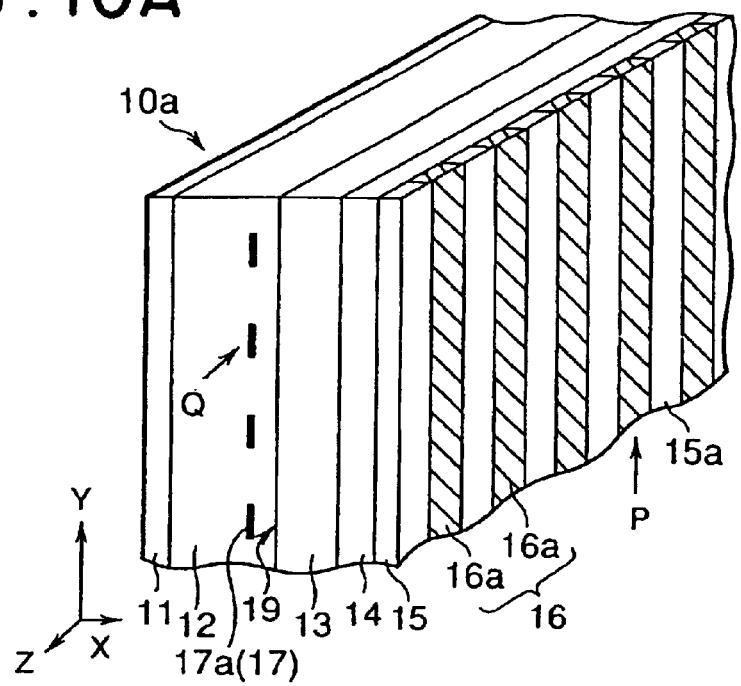
FIG. 10A is a perspective side view of a radiation solid-state detector according to a second embodiment of the present invention.
Figure 10B:
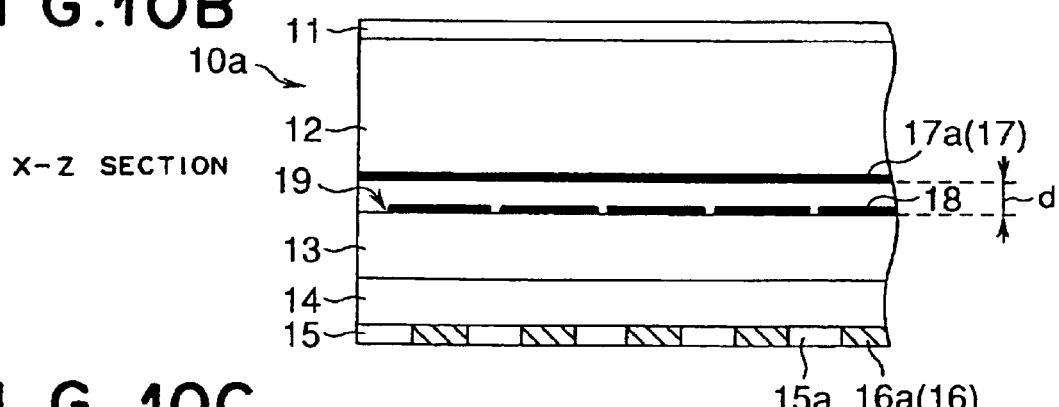
FIG. 10B is an X-Z sectional drawing at the portion shown by arrow-Q.
Figure 10C:
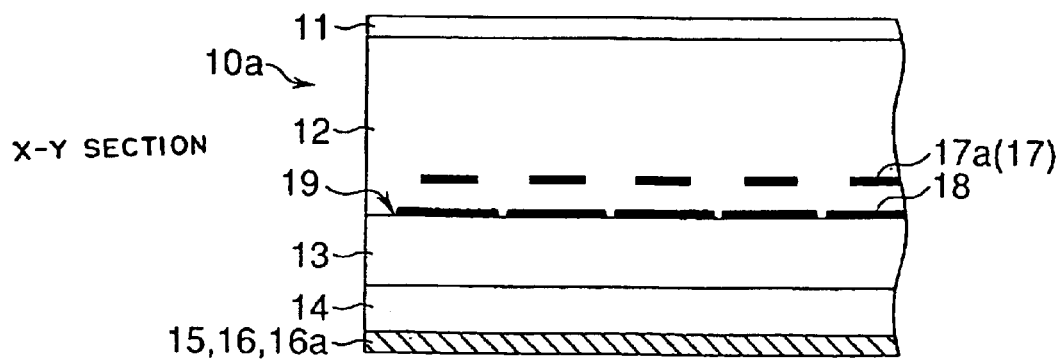
FIG. 10C is an X-Y sectional drawing at the portion shown by arrow-P.

FIG. 10A to FIG. 10C are drawings illustrating the schematic configuration of a radiation solid-state detector according to a second embodiment of the present invention, FIG. 10A being a perspective side view, FIG. 10B being an X-Z sectional drawing at the portion shown by arrow-Q, and FIG. 10C being an X-Y sectional drawing at the portion shown by arrow-P. In FIG. 10A to FIG. 10C, any element equivalent to that of the detector 10 according to the first embodiment as shown in FIG. 1A to FIG. 1C is provided with the same reference numeral, and the description about it will be omitted except when required. With this detector 10a according to the second embodiment, the elements 17a of the sub-electrode 17 are disposed so that they almost orthogonally intersect the elements 16a of the stripe electrode 16.

The microplate 18 is disposed correspondingly in the location where the element 16a intersects the element 17a. When pulsed light is to be projected as the reading light L2, the system is configured so that the pulsed light is projected at least into the locations in the photoconductive layer for reading, 14, which correspond to the locations where the microplates 18 are disposed.

When the elements 17a are thus disposed so that they almost orthogonally intersect the elements 16a, all the elements 17a are connected to the non-inverting input terminals of the current detection amplifiers 71 and the electrode of the electrode layer 11 to carry out charge-rearrangement prior to reading. Thereafter, preferably, only the element 17a corresponding to the scanning position in vertical scanning with the reading light L2, i.e., the element 17a in the reading line, or the elements 17a in the reading line and the lines around it are connected to the non-inverting input terminals of the current detection amplifiers 71 and the electrode of the electrode layer 11, and the other elements 17a are left open. This technique is extremely advantageous from the viewpoint of steady noise.

If all the elements 17a are left to be connected during reading, the distributed capacitance is lower than that when both elements 16a and 17a are disposed so that they are opposed to each other. In this case, there is no need to provide line switching-over means, resulting in the cost being reduced.

Figure 11A:
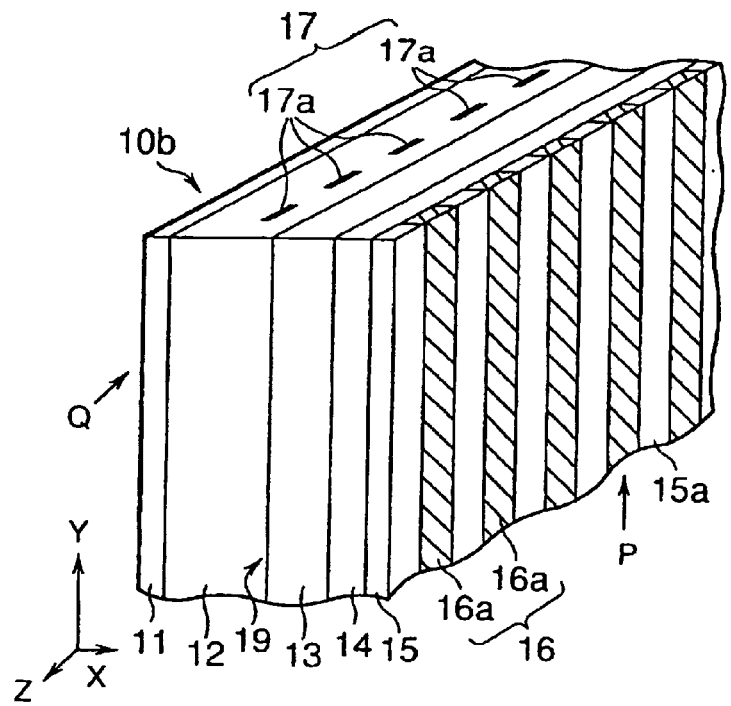
FIG. 11A is a perspective side view of a radiation solid-state detector according to a third embodiment of the present invention.
Figure 11B:
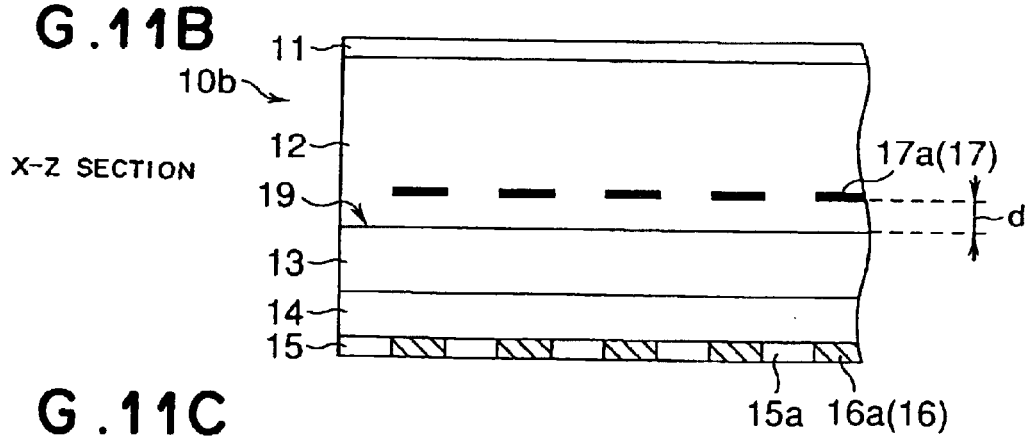
FIG. 11B is an X-Z sectional drawing at the portion shownd by arrow-Q.
Figure 11C:
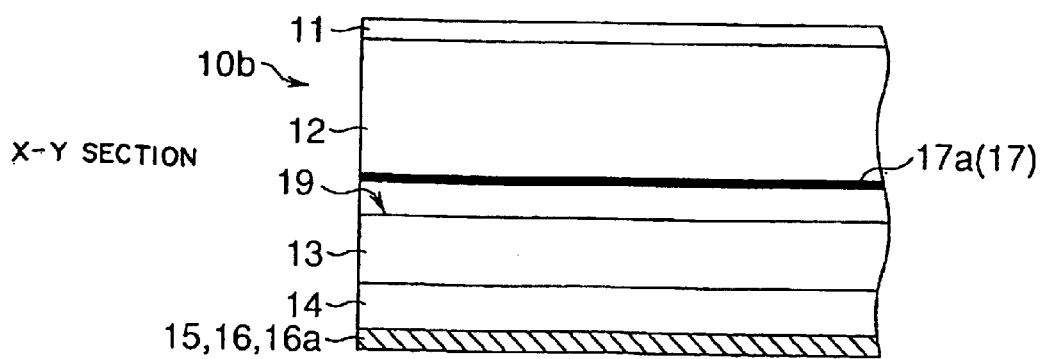
FIG. 11C is an X-Y sectional drawing at the portion shown by arrow-P.

FIG. 11A to FIG. 11C are drawings illustrating the schematic configuration of a radiation solid-state detector according to a third embodiment of the present invention, FIG. 11A being a perspective side view, FIG. 11B being an X-Z sectional drawing at the portion shown by arrow-Q, and FIG. 11C being an X-Y sectional drawing at the portion shown by arrow-P. In FIG. 11A to FIG. 11C, any element equivalent to that of the detector 10 according to the first embodiment as shown in FIG. 1A to FIG. 1C is provided with the same reference numeral, and the description about it will be omitted except when required. With this detector 10b according to the third embodiment, the microplates 18 for the above-stated detector 10 are removed.

Therefore, when the quantity of the recording light L1 is small, the negative charges are attracted toward the center of the respective elements 16a, resulting in the latent image charges being distributed to each element 16a, and the latent image charges being stored in accordance with the arrangement of the elements 16a. Therefore, by narrowing the spacing between elements 16a, the locations where the latent image charges are stored are fixed at least for the direction of arrangement of the elements 16a.

Regardless of whether the microplates 18 are provided or not, the smaller the sum of the thickness of the charge transporting layer 13 and that of the photoconductive layer for reading, 14, for a given thickness of the photoconductive layer for recording, 12, the lower the ratio of the width of the element 16a to the pitch for the elements 16a (preferably, 75% or less), and if the sum of the thickness of the charge transporting layer 13 and that of the photoconductive layer for reading, 14, is approximately equal to or less than the pitch for the stripe electrode 16 and the smaller the sum, the more clearly the area where there is no electric field will be formed. Further, by decreasing the mobility of the negative charge in the charge transporting layer 13 to a value sufficiently lower than that of the positive charge (for example, to $1/10^3$ or less), the ability of storing the latent image charges is improved and also the ability of maintaining the static latent image is enhanced.

FIG. 12A to FIG. 12C are drawings illustrating the schematic configuration of a radiation solid-state detector according to a fourth embodiment of the present invention, FIG. 12A being a perspective side view, FIG. 12B being an X-Z sectional drawing at the portion shown by arrow-Q, and FIG. 12C being an X-Y sectional drawing at the portion shown by arrow-P. In FIG. 12A to FIG. 12C, any element equivalent to that of the detector 10 according to the first embodiment as shown in FIG. 1A to FIG. 1C is provided with the same reference numeral, and the description about it will be omitted except when required. With this detector 10c according to the fourth embodiment, the above-stated detector 10a is combined with the above-stated detector lob, the elements 17a of the sub-electrode 17 being disposed roughly orthogonally to the elements 16a of the stripe electrode 16, and the microplates 18 being removed. The detailed description of the function when this detector 10c is used will be omitted. The function of the detector 10c is based on that of the detector 10, providing the function as a result of combination of the detector 10a with the detector 10b.

When pulsed light is to be projected as the reading light L2, the system is configured so that the pulsed light is projected onto the locations in the photoconductive layer for reading, 14, which correspond to the locations where the elements 16a intersect the elements 17a.

Figure 13A:
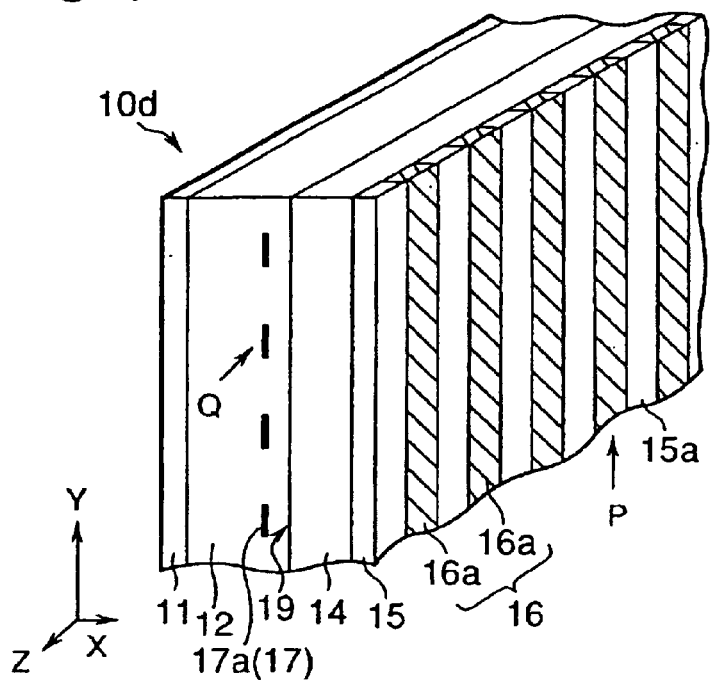
FIG. 13A is a perspective side view of a radiation solid-state detector according to a fifth embodiment of the present invention.
Figure 13B:
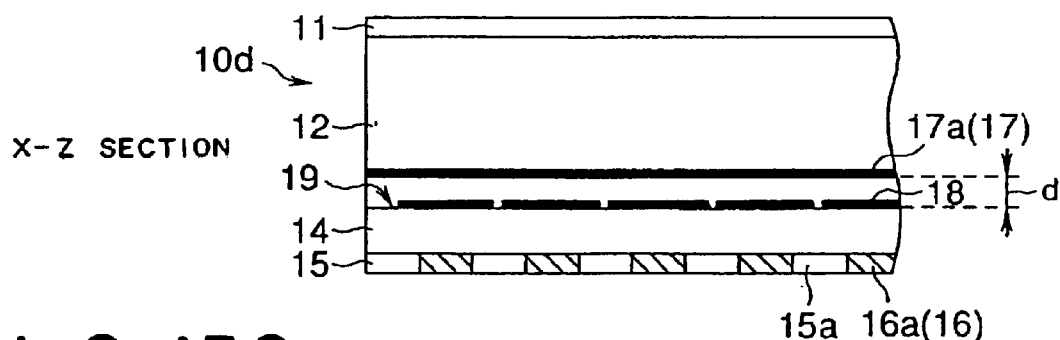
FIG. 13B is an X-Z sectional drawing at the portion shown by arrow-Q.
Figure 13C:
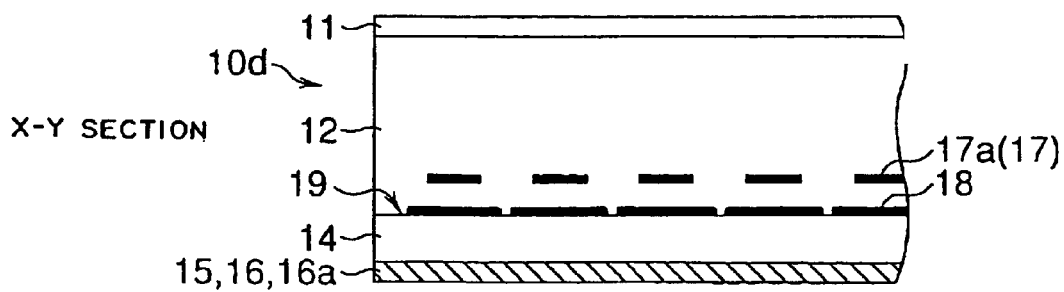
FIG. 13C is an X-Y sectional drawing at the portion shown by arrow-P.

FIG. 13A to FIG. 13C are drawings illustrating the schematic configuration of a radiation solid-state detector according to a fifth embodiment of the present invention, FIG. 13A being a perspective side view, FIG. 13B being an X-Z sectional drawing at the portion shown by arrow-Q, and FIG. 13C being an X-Y sectional drawing at the portion shown by arrow-P. In FIG. 13A to FIG. 13C, any element equivalent to that of the detector 10 according to the first embodiment as shown in FIG. 1A to FIG. 1C is provided with the same reference numeral, and the description about it will be omitted except when required. With this detector 10d according to the fifth embodiment, the charge transporting layer 13 for the above-stated detector 10a is removed. The entire thickness of the detector 10d can therefore be reduced by the thickness of the charge transporting layer 13.

As described above, when the microplates 18 are provided, the negative charges generated in the photoconductive layer for recording, 12, are stored on the microplates 18 in the recording process. Therefore, if the charge transporting layer 13, which has nonconductivity to the latent image charges, is not provided, the latent image charges can be stored only with the microplates 18. The negative charges which have not been stored on the microplates 18 are passed though the photoconductive layer for reading, 14, and recoupled with the positive charges stored on the stripe electrode 16, thus being cancelled. In the reading process, the latent image charges around the respective microplates 18 can be attracted toward the central portion of the plates to be sufficiently discharged to minimize the quantity of the charges left unread.

Figure 14A:
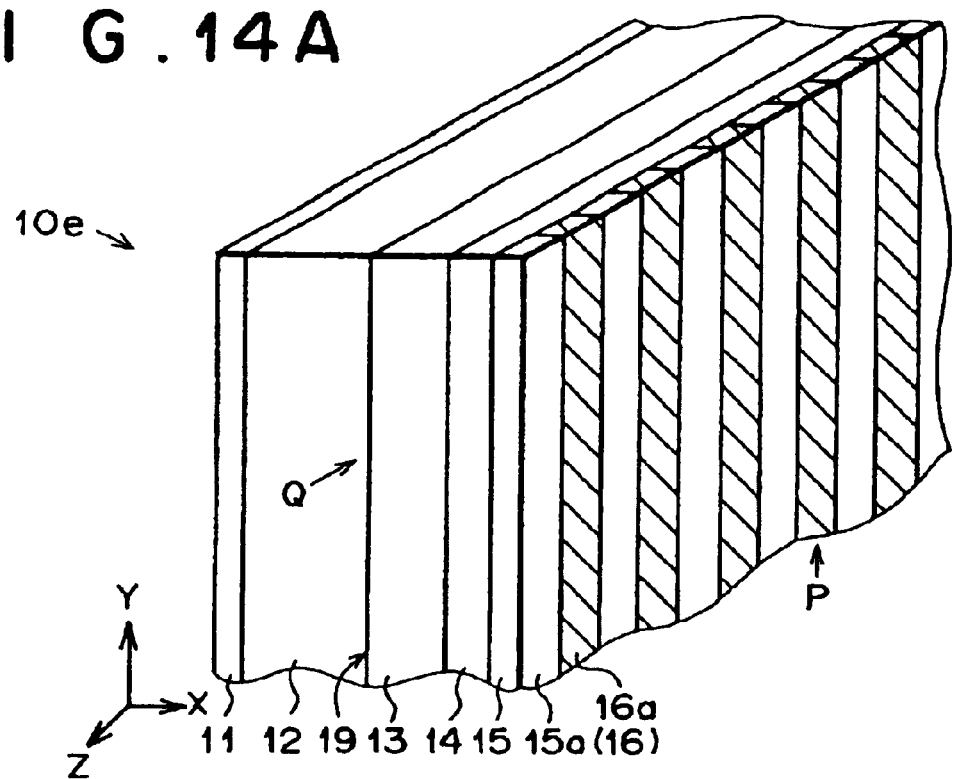
FIG. 14A is a perspective side view of a radiation solid-state detector according to a sixth embodiment of the present invention.
Figure 14B:
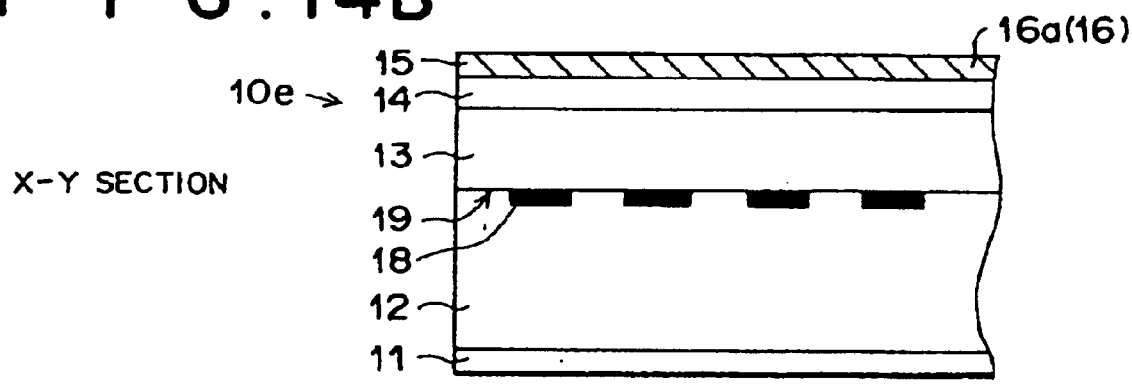
FIG. 14B is an X-Z sectional drawing at the portion shown by arrow-Q.
Figure 14C:
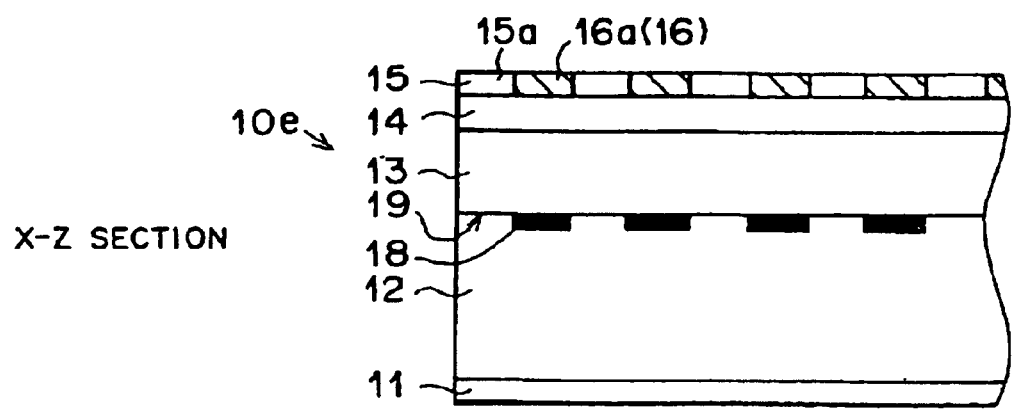
FIG. 14C is an X-Y sectional drawing at the portion shown by arrow-P.

FIG. 14A to FIG. 14C are drawings illustrating the schematic configuration of a radiation solid-state detector according to a sixth embodiment of the present invention, FIG. 14A being a perspective side view, FIG. 14B being an X-Y sectional drawing at the portion shown by arrow-Q, and FIG. 14C being an X-Z sectional drawing at the portion shown by arrow-P. In FIG. 14A to FIG. 14C, any element equivalent to that of the detector 10 according to the first embodiment as shown in FIG. 1A to FIG. 1C is provided with the same reference numeral, and the description about it will be omitted except when required.

With the detector 10e according to the sixth embodiment, the size of the microplates 18 for the detector 10 is changed, the length of the side of each microplate 18 being specified to be smaller than the pixel pitch, i.e., less than half of the arrangement pitch for the elements 16a. As shown in FIG. 14B and FIG. 14C, each microplate 18 is located just below the element 16a, i.e., in the central portion of the pixel, and the microplates 18 are disposed at the pixel pitch for the longitudinal direction of the elements 16a.

Figure 15A:
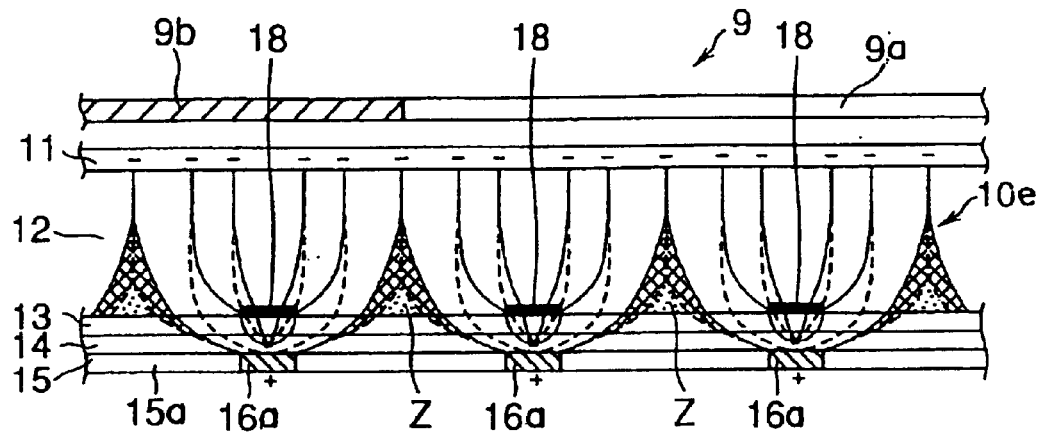
FIG. 15A to FIG. 15C are drawings illustrating the method for recording a static latent image in the radiation solid-state detector of the sixth embodiment.
Figure 15B:
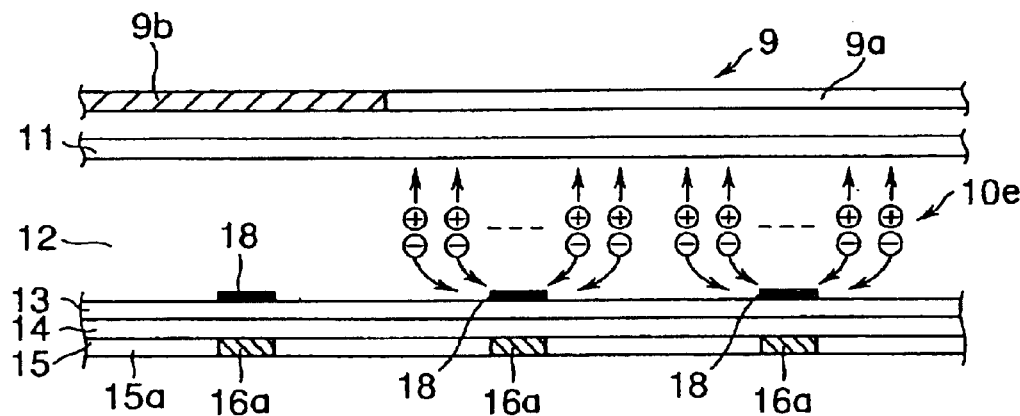
Figure 15C:
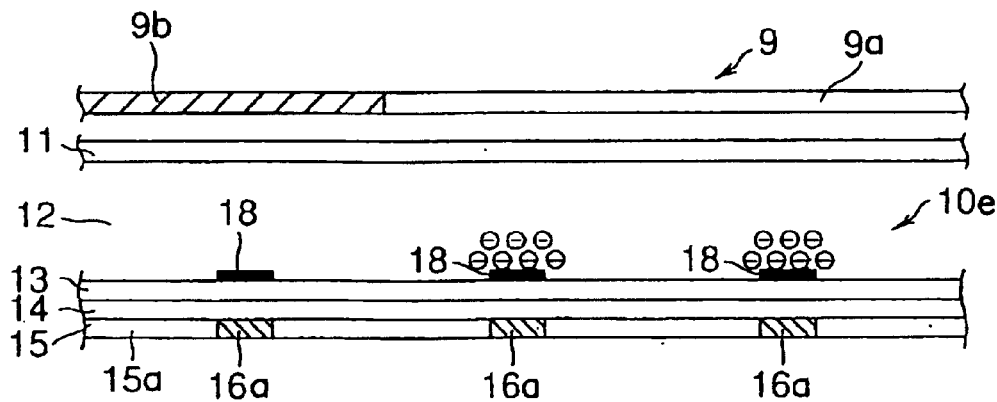

An electric charge model in the static latent image recording process when the detector 10e is used is shown in FIG. 15A to FIG. 15C, while that in the static latent image reading process is shown in FIG. 16A to FIG. 16C.

In the recording process, the U-shaped electric field is further concentrated on the microplate 18, i.e., the pixel central portion in the vicinity of the charge storing section 19, because, in the charge storing section 19, the microplate 18 which is shorter than the pixel pitch is provided for the respective elements 16a of the stripe electrode 16. Therefore, as the hatched areas indicated with an arrow Z in FIG. 15A, large areas where there is no electric field are formed in the charge storing section 19.

The negative charges generated in the photoconductive layer for recording, 12, are transferred along this electric field so that they are concentrated on the respective microplates 18 (FIG. 15B). Then, they are stopped, being caught by and stored on the respective microplates 18(FIG. 15C). The charge transporting layer 13 acts as an insulator for charges having the same polarity as that of the charges stored in the electrode layer 11, (in this example, a negative charge), i.e., the latent image charges, and so, of the negative charges which have been transferred in the photoconductive layer for recording, 12, the charges which have not been caught by the microplates 18 are stopped in the charge storing section 19, which is the boundary between the photoconductive layer for recording, 12, and the charge transporting layer 13. As a result, charges are stored not only on the respective microplates 18, but also around them in the charge storing section 19, which means that the negative charges are stored as the latent image charges on and around the respective microplates 18 (FIG. 15D).

Thus, with the detector 10e, the latent image charges are stored on and around the respective microplates 18, and so, the pixels can be formed in the fixed locations for both the horizontal scanning and the vertical scanning, and for both scanning directions, the static latent image can be recorded with high sharpness (spatial resolution).

On the other hand, in the reading process, the latent image charges are sequentially cancelled, starting from those in the central portion, as with the above-stated detector 10. The microplate 18 for the detector 10e is smaller than that for the detector 10, the latent image charges being stored not only on the respective microplates 18 but also around them (FIG. 16A), and the latent image charges stored around the microplate 18 cannot be said to-always have the same potential as those on it, being left in their original locations if the reading progresses. However, in the recording process, the latent image charges are stored, being concentrated on the respective microplates 18, which means, they are stored in the respective pixel central portions more intensively than are when the microplates 18 are not provided, which reduces the possibility of charges being left unread in the final process of reading (FIG. 16B and FIG. 16C). In addition, because the charges are stored not only on the respective microplates 18, but also around them, the quantity of the stored charges will not be reduced, and the level of the image signal obtained by reading will not be lowered. In other words, with this detector 10e, the image signal level is not deteriorated, and it is possible to form the pixels in the fixed locations on the detector, and to realize both improvement of the reading efficiency and enhancement of the sharpness. The technique which sets the length of each side, i.e., the size of the microplate 18 at a value smaller than the pixel pitch can be applied not only to the detector 10, but also to the above-stated other detectors, and the later described detectors.

Figure 17A:
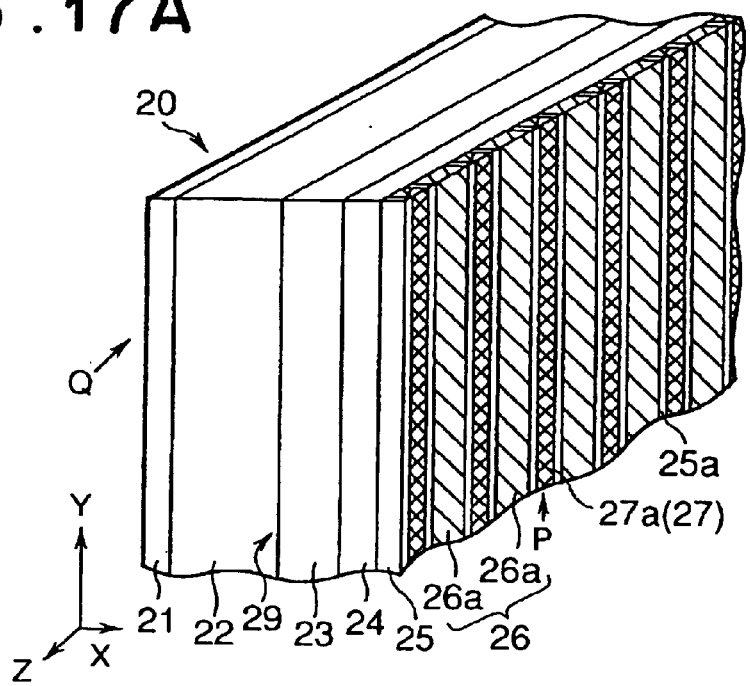
FIG. 17A is a perspective side view of a radiation solid-state detector according to a seventh embodiment of the present invention.
Figure 17A:
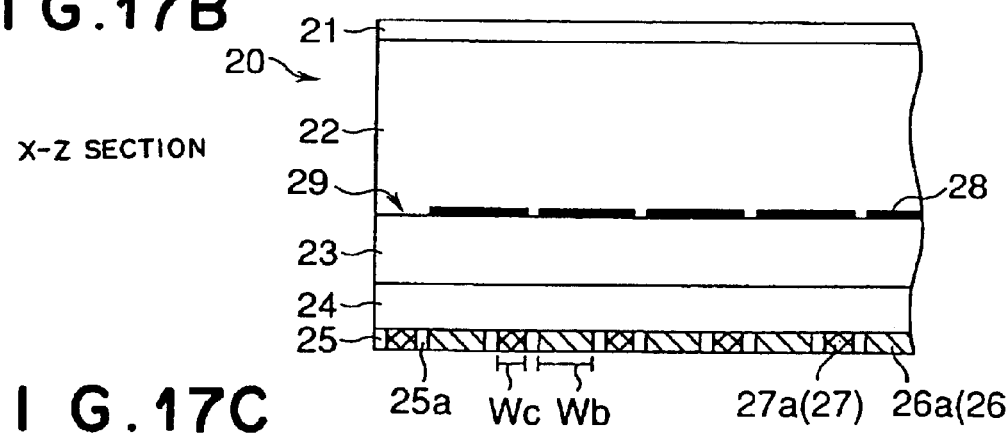
Figure 17A:
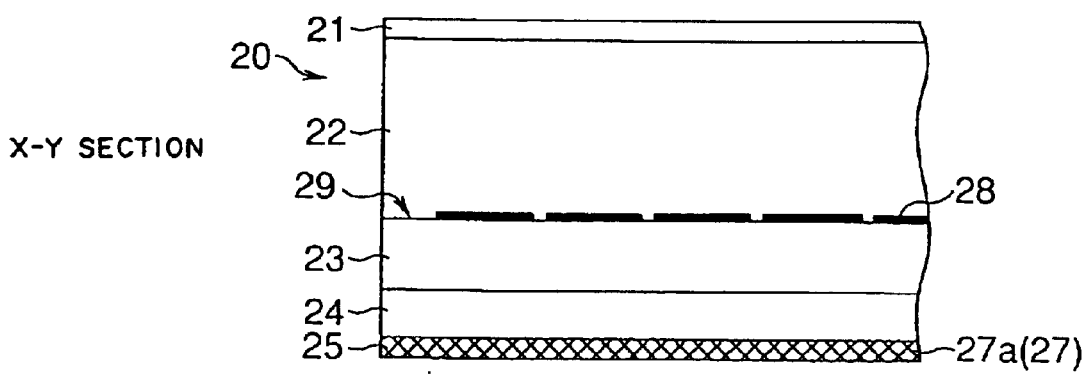

A seventh embodiment of the radiation solid-state detector according to the present invention will be described with reference to FIG. 17A to FIG. 17C. FIG. 17A is a perspective side view of a detector 20, FIG. 17B is an X-Z sectional drawing at the portion shown by arrow-Q, and FIG. 17C is an X-Y sectional drawing at the portion shown by arrow-P.

This detector 20 comprises an electrode layer 21, a photoconductive layer for recording, 22, a charge transporting layer 23, a photoconductive layer for reading, 24, and an electrode layer 25 which are stacked together in this order, providing a sub-electrode 27 in the electrode layer 25. As the substances for these layers, the substances for the detector 10 according to the first embodiment are used. As with the detector 10, the electrode of the electrode layer 25 is a stripe electrode 26 with which a number of elements 26a are arranged in the form of stripes, and in a charge storing section 29, which is the boundary between the photoconductive layer for recording, 22, and the charge transporting layer 23, microplates 28 which have roughly the same size as the pixel pitch are provided.

With the sub-electrode 27 provided in the electrode layer 25, a number of elements 27a are arranged in the form of stripes, the elements 27a being arranged so that the element 27a and the element 26a of the stripe electrode 26a are alternately disposed. An area 25a between both elements, is filled with a high-polymer material, such as polyethylene in which some quantity of carbon black or other pigment is dispersed. The stripe electrode 26 and the sub-electrode 27 are electrically insulated from each other. The sub-electrode 27 is a conductive member for outputting an electric signal at a level corresponding to the quantity of the latent image charges stored in the charge storing section 29 formed roughly at the boundary between the photoconductive layer for recording, 22, and the charge transporting layer 23.

The sub-electrode 27 is coated with such a metal as AL and Cr, being formed so as to have a shading property with respect to the reading light L2, and therefore, no pairs of charges for taking out a signal are generated in the locations in the photoconductive layer for reading, 24, which correspond to the elements 27a.

The microplate 28 is provided not only just above the element 26a, but also extends to just above the element 27a. In this way, the latent image charges stored on the microplate 28 are always held at the same potential, which allows them to move freely on the microplate 28, making the discharge in reading easier. The microplate 28 may be disposed so that its center is located just above the element 27a to make collection of the charges around the pixel easier.

When the detector 10 is used, the specified control voltage is applied to the sub-electrode 17 so that the latent image charges are stably stored in the charge storing section 19. However, with this detector 20, the sub-electrode 27 is provided in the electrode layer 25, so that, by applying the control voltage so that the sub-electrode 27 has the same potential as that of the stripe electrode 26, a uniform electric field can be formed between the electrode layer 21 and the electrode layer 25. This is preferable when the size of the microplate 28 is the same as that of the entire pixel, i.e., the pixel pitch. By controlling the sub-electrode 27 so that it is open or has a potential closer to that of the electrode layer 21 than that of the stripe electrode 26, the latent image charges can be stored more intensively above the stripe electrode 26. This technique can be effectively used when the microplate 28 is smaller than the pixel pitch.

With this detector 20, a capacitor $C_{*c}$ is formed between the charge storing section 29 and the sub-electrode 27 through the photoconductive layer for reading, 24, and the charge transporting layer 23. Providing the sub-electrode 27 will have practically no great effect on the capacitance value $C_a$ of the capacitor $C_{*a}$ formed between the electrode layer 21 and the charge storing section 29 through the photoconductive layer for recording, 22, and the capacitance value $C_b$ of the capacitor $C_{*b}$ formed between the stripe electrode 26 and the charge storing section 29 through the photoconductive layer for reading, 24, and the charge transporting layer 23.

Here, in consideration of the capacitance values of the capacitors $C_{*b}$ and $C_{*c}$ it will be noted that the ratio of the capacitance values $C_b$ and $C_c$ is that of the widths $W_b$ and $W_c$ of the elements 26a and 27a. This means that, as with the above-stated detector 10, the quantity $Q_{+b}$ of the positive charges distributed to the capacitor $C_{*b}$ in the charge rearrangement can be reduced to below that when the sub-electrode 27 is not provided, and the current flowing out from the detector 20 to the outside can be increased to above that when the sub-electrode 27 is not provided.

With the detector 10, the capacitance values of the capacitors are defined by the film thickness ratio, but, with this detector 20, the capacitance values of at least the capacitors $C_{*b}$ and $C_{*c}$ are defined by the width ratio for the element 26a and the element 27a constituting the respective electrodes, which means that, the construction of the detector is simple, and the manufacturing can be performed easily.

FIG. 18A to FIG. 18C are drawings illustrating the schematic configuration of a radiation solid-state detector according to a eighth embodiment of the present invention, FIG. 18A being a perspective side view, FIG. 18B being an X-Z sectional drawing at the portion shown by arrow-Q, and FIG. 18C being an X-Y sectional drawing at the portion shown by arrow-P. In FIG. 18A to FIG. 18C, any element equivalent to that of the detector 20 according to the seventh embodiment as shown in FIG. 17A to FIG. 17C is provided with the same reference numeral, and the description about it will be omitted except when required. With this detector 20a according to the eighth embodiment, the microplates 28 for the above-stated detector 20 are removed, and in recording, the stripe electrode 26 is connected to the sub-electrode 27 to positively utilize the sub-electrode 27 for formation of the electric field.

Figure 19A:
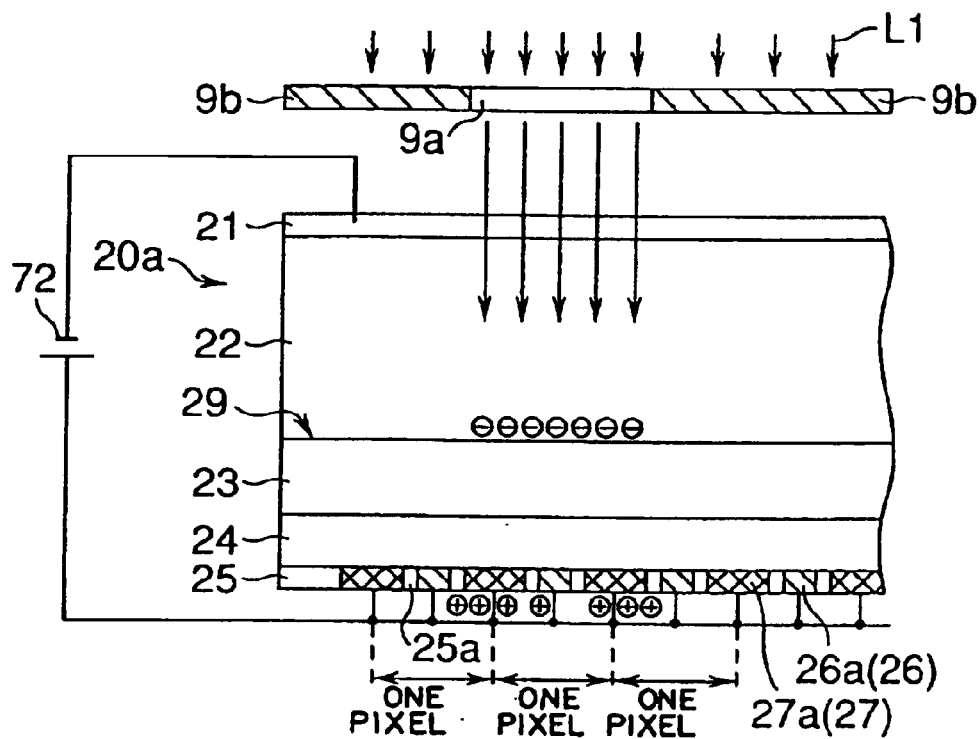
FIG. 19A is an electric charge model illustrating the static latent image recording process.
Figure 19B:
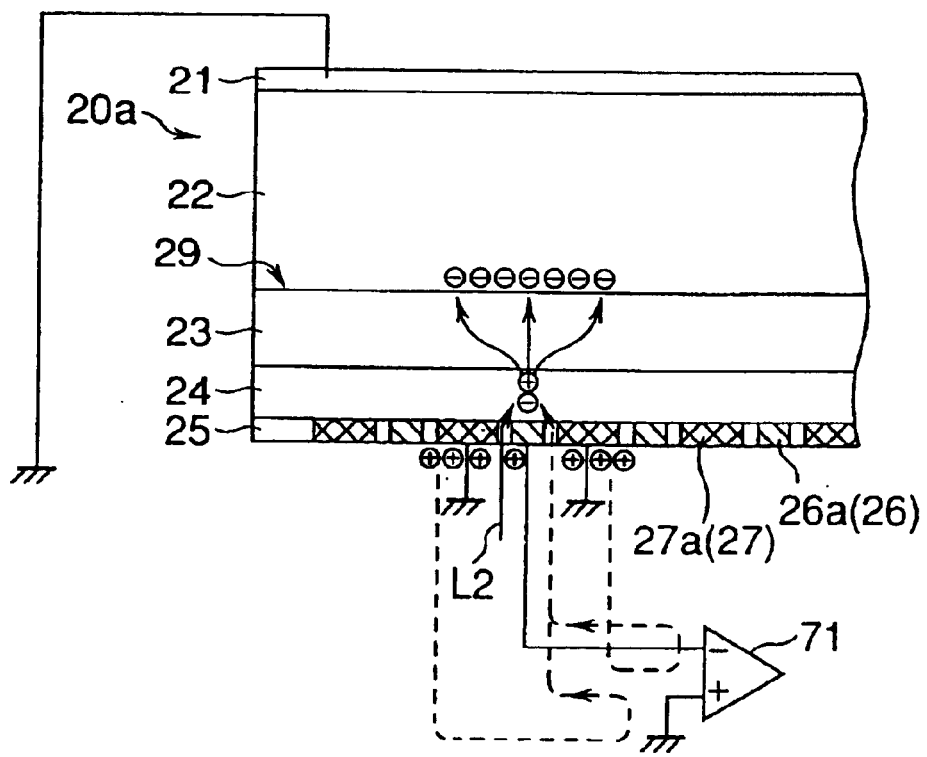
FIG. 19B is an electric charge model illustrating the static latent image reading process, in the case where the radiation solid-state detector of the eighth embodiment is used.

FIG. 19A is an electric charge model illustrating the static latent image recording process when the stripe electrode 26 is connected with the sub-electrode 27 for recording, and FIG. 19B is an electric charge model illustrating the static latent image reading process for the permeating portion 9a of the subject 9. When recording is carried out with the stripe electrode 26 being connected with the sub-electrode 27, the latent image charges are stored not only in the locations corresponding to the elements 26a, but also in those corresponding to the elements 27a. When the reading light L2 is projected onto the photoconductive layer for reading, 24, in reading, the latent image charges in the locations corresponding to the two elements 27a, i.e., the locations above both elements 27a, are sequentially read out through the two elements 27a. In other words, as shown in FIG. 19B, discharge is caused from the element 26a located at the center of the pixel toward the latent image charges in the locations corresponding to (above) the elements 27a adjacent to it, whereby reading is progressed. To take out more signal charges, it is recommended that the width of the element 27a be larger than that of the element 26a.

Figure 20A:
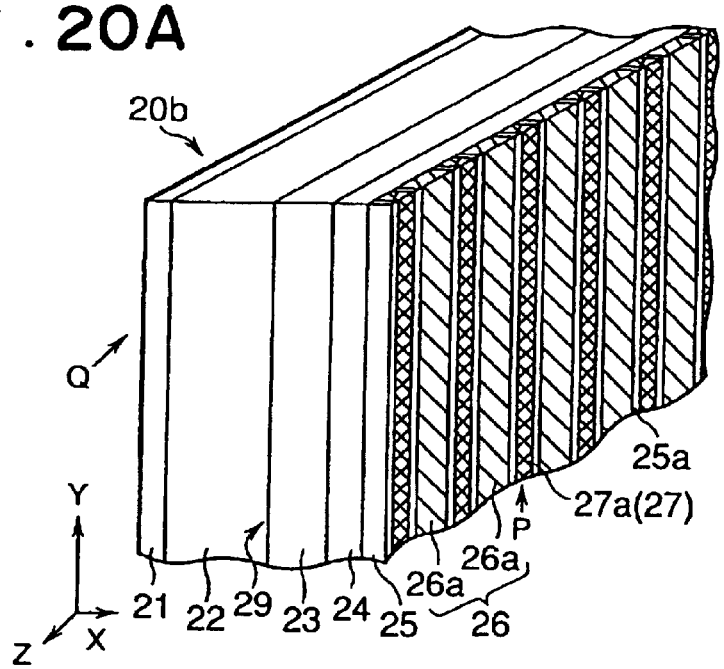
FIG. 20A is a perspective side view of a radiation solid-state detector according to a ninth embodiment of the present invention.
Figure 20B:
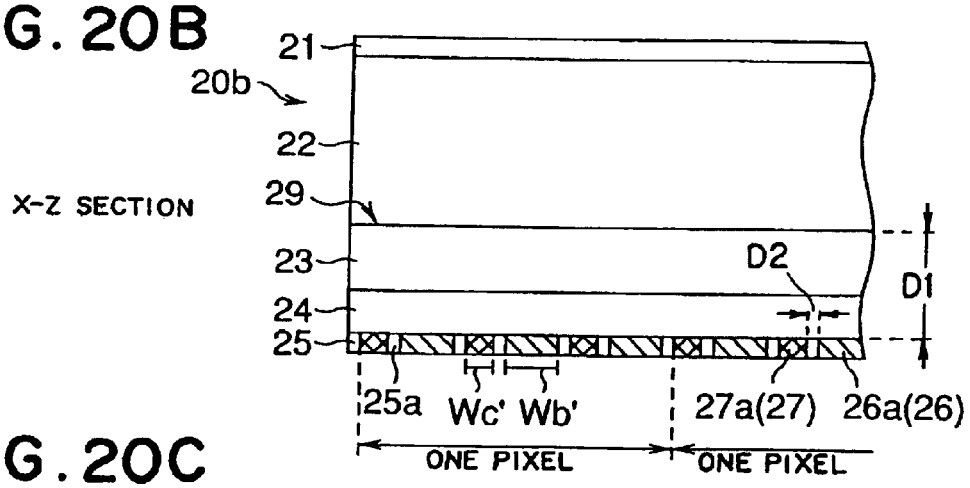
FIG. 20B is an X-Z sectional drawing at the portion shown by arrow-Q.
Figure 20C:
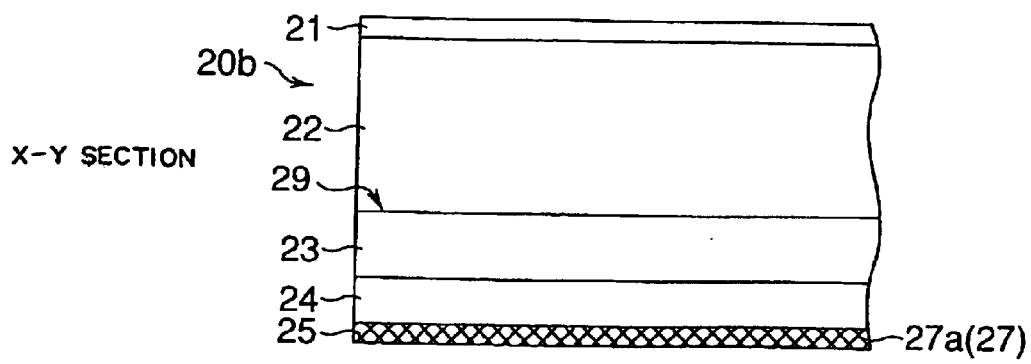
FIG. 20C is an X-Y sectional drawing at the portion shown by arrow-P.

FIG. 20A to FIG. 20C are drawings illustrating the schematic configuration of a radiation solid-state detector according to a ninth embodiment of the present invention, FIG. 20A being a perspective side view, FIG. 20B being an X-Z sectional drawing at the portion shown by arrow-Q, and FIG. 20C being an X-Y sectional drawing at the portion shown by arrow-P. In FIG. 20A to FIG. 20C, any element equivalent to that of the detector 20 according to the seventh embodiment as shown in FIG. 17A to FIG. 17C is provided with the same reference numeral, and the description about it will be omitted except when required. With this detector 20b according to the ninth embodiment of the present invention, the microplates 28 for the above-stated detector 20 are removed, and the element 26a of the stripe electrode 26 and the element 27a of the sub-electrode 27 are alternately disposed in one pixel. With the detector 20b shown, three elements 26a and three elements 27a are provided in one pixel. When this detector 20b is used for recording and reading, it is recommended that the elements 26a and the elements 27a be handled in units of one pixel. Assuming that the size of one pixel for the detector 20 is the same as that for the detector 20b, the width $W_b'$ of the element 26a and the $W_c'$ of the element 27a for the detector 20b are set more narrowly than the width $W_b$ and the $W_c$ for the above-stated detector 20. Now that semiconductor formation technology is very advanced, it is easy to form both elements 26a and 27a sufficiently narrowly to manufacture the detector 20b.

With this detector 20b, the ratio of the distance D1 between the charge storing section 29 and the electrode layer 25 to the distance D2 between both elements 26a and 27a can be easily increased to a value higher than that for the above-stated detector 20a according to the eighth embodiment. In this way, discharge tends to be easily caused from the element 26a toward the latent image charges in the locations corresponding to the elements 27a adjacent to it, whereby the reading time can be decreased to below that for the detector 20. This technique is particularly effective when no microplates 28 are provided.

Figure 21A:
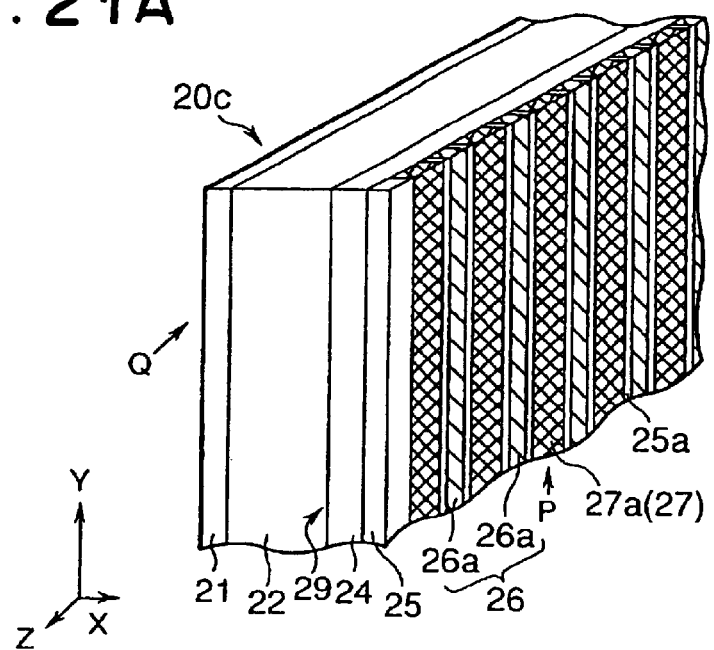
FIG. 21A is a perspective side view of a radiation solid-state detector according to a tenth embodiment of the present invention.
Figure 21B:
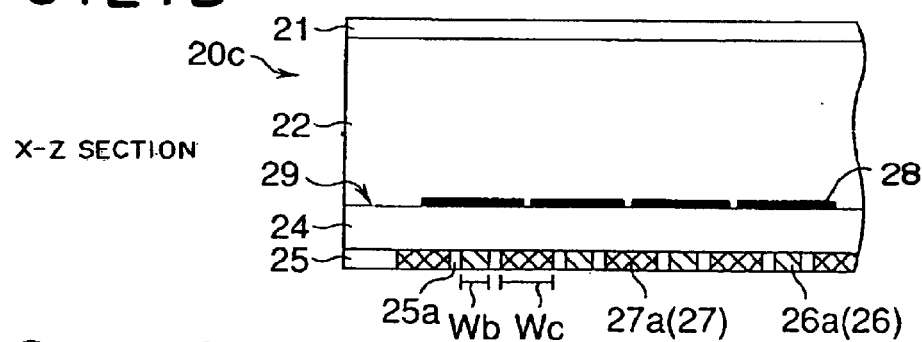
FIG. 21B is an X-Z sectional drawing at the portion shown by arrow-Q.
Figure 21C:
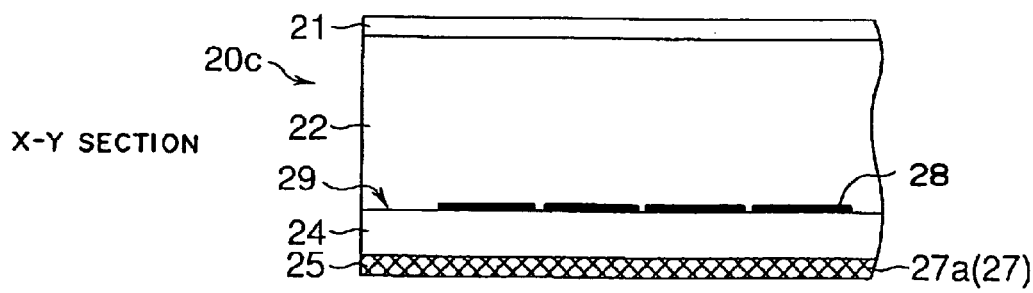
FIG. 21C is an X-Y sectional drawing at the portion shown by arrow-P.

FIG. 21A to FIG. 21C are drawings illustrating the schematic configuration of a radiation solid-state detector according to a tenth embodiment of the present invention, FIG. 21A being a perspective side view, FIG. 21B being an X-Z sectional drawing at the portion shown by arrow-Q, and FIG. 21C being an X-Y sectional drawing at the portion shown by arrow-P. In FIG. 21A to FIG. 21C, any element equivalent to that of the detector 20 according to the seventh embodiment as shown in FIG. 17A to FIG. 17C is provided with the same reference numeral, and the description about it will be omitted except when required. With this detector 20c according to the tenth embodiment of the present invention, the charge transporting layer 23 for the above-stated detector 20a is removed, and the configuration corresponds to that of the above-stated detector 10d.

The detailed description of the function in the recording process and the reading process when this detector 20c is used will be omitted. As with the above-stated detector 10d, the negative charges generated in the charge transporting layer 23 can be stored on the microplates 28 in the recording process, and in the reading process, the negative charges can be sufficiently discharged to minimize the quantity of the charges left unread.

An eleventh embodiment of the radiation solid-state detector according to the present invention will be described with reference to FIG. 22A to FIG. 22C. FIG. 22A is a perspective side view of a detector 30; FIG. 22B is an X-Z sectional drawing at the portion shown by arrow-Q; and FIG. 22C is an X-Y sectional drawing at the portion shown by arrow-P.

This detector 30 comprises an electrode layer 31, a photoconductive layer for recording, 32, a charge transporting layer 33, a photoconductive layer for reading, 34, and an electrode layer 35 which are stacked together in this order, providing a sub-electrode 37 at the boundary between the photoconductive layer for reading, 34, and the charge transporting layer 33. As the substances for these layers, the substances for the detector 10, etc. according to the first embodiment are used. As with the detector 10, etc., the electrode of the electrode layer 35 is a stripe electrode 36 with which a number of elements 36a are arranged in the form of stripes, and microplates 38 which have roughly the same size as the pixel pitch are provided in a charge storing section 39, which is the boundary between the photoconductive layer for recording, 32, and the charge transporting layer 33. An area 35a is filled with a high-polymer material, such as polyethylene in which some quantity of carbon black or other pigment is dispersed.

With the sub-electrode 37, a number of elements 37a are arranged in the form of stripes, and the elements 37a are disposed so that they almost orthogonally intersect the elements 36a of the stripe electrode 36. Each element 37a may be located just above the element 36a of the stripe electrode 36, both being disposed so that they are opposed to each other. The sub-electrode 37 may be either permeable or not permeable to the recording light and the reading light.

With this detector 30, the sub-electrode 37 is provided at the boundary between the photoconductive layer for reading, 34, and the charge transporting layer 33. Therefore, the electric field formed between the photoconductive layer for reading, 34, and the charge transporting layer 33 is slightly disturbed by the sub-electrode 37, but, the latent image charge generated in the photoconductive layer for recording, 32, will not be caught by the sub-electrode 37.

With this detector 30, a capacitor $C_{*c}$ is formed between the charge storing section 39 and the sub-electrode 37 through the charge transporting layer 33. Providing the sub-electrode 37 will have practically no great effect on the capacitance value $C_a$ of the capacitor $C_{*a}$ formed between the electrode layer 31 and the charge storing section 39 through the photoconductive layer for recording, 32, and the capacitance value $C_b$ of the capacitor $C_{*b}$ formed between the stripe electrode 36 and the charge storing section 39 through the photoconductive layer for reading, 34, and the charge transporting layer 33.

The capacitance values of the capacitors are defined by the film thickness ratio, as with the detector 10. Unlike the detector 20, the detector 30 provides the sub-electrode 37 outside the electrode layer 35, which means that, the width and the pitch for the elements 37a can be set independently of the width and the pitch for the elements 36a, so the capacitance values can be set more easily than with the detector 20.

Also with this detector 30, as a result of the capacitor $C_{*c}$ being formed, the quantity $Q_{+b}$ of the positive charges distributed to the capacitor $C_{*b}$ in the charge rearrangement can be reduced to below that when the sub-electrode 37 is not provided, and the current I flowing out from the detector 30 to the outside can be increased to above that when the sub-electrode 37 is not provided.

With the detector 20, the elements 27a of the sub-electrode 27 are disposed in parallel with the elements 26a of the stripe electrode 26. Therefore, all the elements 27a must be electrically connected for carrying out the reading, which increases the distributed capacitance, being disadvantageous from the viewpoint of fixed noise. On the other hand, with the detector 30, when the elements 37a are disposed roughly orthogonally to the elements 36a, the charges can be rearranged by carrying out switchover so that only the element 37a corresponding to the scanning position in vertical scanning with the reading light L2 is connected to the electrode layer 31 and the stripe electrode 36, and the other elements 37a can be left open, which means that, the distributed capacitance which does not contribute to the signal reading can be reduced to an extremely low value for reduction of the fixed noise.

Because the sub-electrode 37 is located closer to the charge storing section 39 than to the photoconductive layer for reading, 34, in the detector 30, it has no effect on the charge generation process by the reading light L2, and so, whether or not the sub-electrode 37 is permeable to the reading light L2 has no effect on the reading resolution.

When the sub-electrode in the form of stripes is provided between the photoconductive layer for reading and the charge transporting layer, the width and the pitch for the elements can be freely set as stated above, which means that, each element 37a may be disposed so that it is located under and between microplates 38 rather than just under the microplates 38, and the two elements 37a sandwiching the microplates 38 related to the reading line may be shorted simultaneously to carry out the reading. In this case, the size of the microplates 38 is generally set at a value approximately equal to the pixel pitch, for example, when the width of the element 36a is 75 μm, and the pitch is 100 μm, the size of the microplate 38 is set at approx. 75 μm square. Therefore, in this case, it is recommended to set the width of the element 37a at 10 μm, and the pitch at 100 μm, for example. Also when no microplates are provided, two elements 37a can be shorted simultaneously to read out the charges for the pixels sandwiched by these two elements 37a.

Figure 23A:
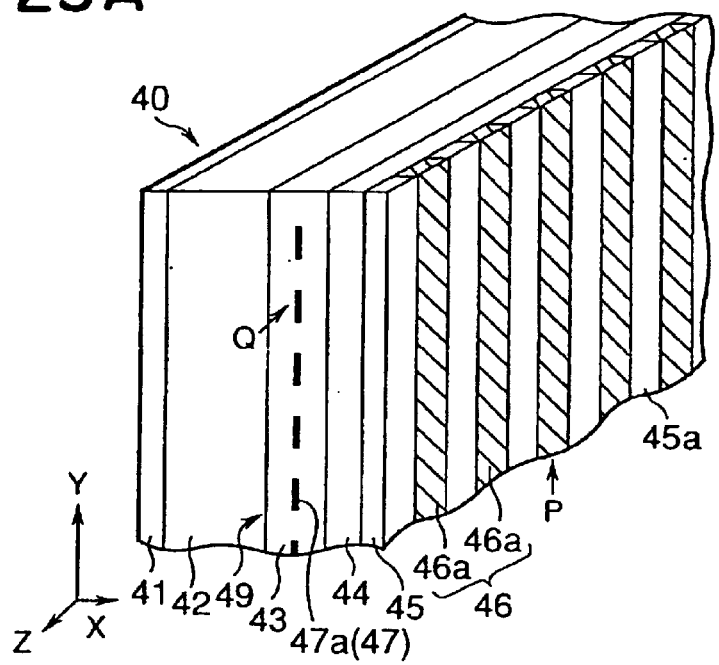
FIG. 23A is a perspective side view of a radiation solid-state detector according to a twelfth embodiment of the present invention.
Figure 23B:
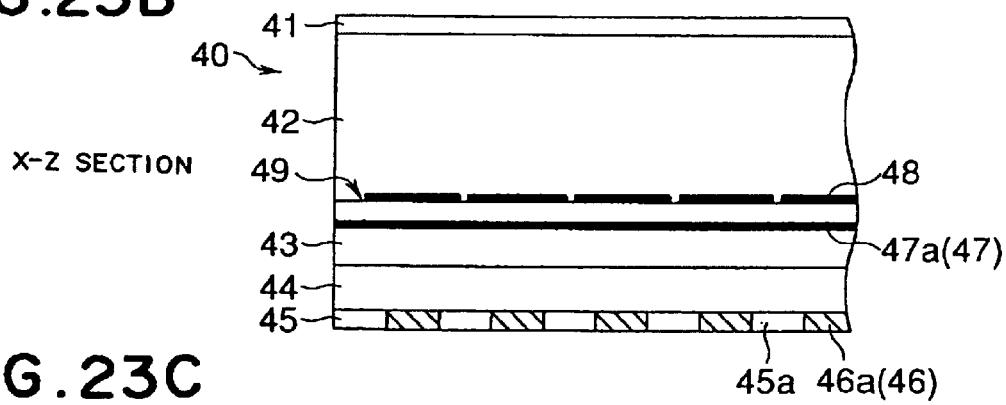
FIG. 23B is an X-Z sectional drawing at the portion shown by arrow-Q.
Figure 23C:
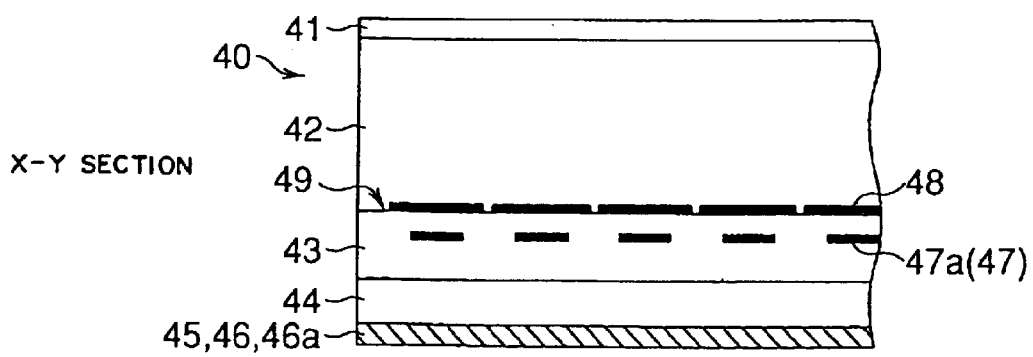
FIG. 23C is an X-Y sectional drawing at the portion shown by arrow-P.

Next, a twelfth embodiment of the radiation solid-state detector according to the present invention will be described with reference to FIG. 23A to FIG. 23C. FIG. 23A is a perspective side view of a detector 40, FIG. 23B is an X-Z sectional drawing at the portion shown by arrow-Q, and FIG. 23C is an X-Y sectional drawing at the portion shown by arrow-P.

This detector 40 comprises an electrode layer 41, a photoconductive layer for recording, 42, a charge transporting layer 43, a photoconductive layer for reading, 44, and an electrode layer 45 which are stacked together in this order, providing a sub-electrode 47 in the charge transporting layer 43. As the substances for these layers, the substances for the detector 10, etc. according to the first embodiment are used. As with the detector 10, etc., the electrode of the electrode layer 45 is a stripe electrode 46 with which a number of elements 46a are arranged in the form of stripes, and microplates 48 which are effective to concentrate the latent image charges on the pixel central portion are provided in a charge storing section 49, which is the boundary between the photoconductive layer for recording, 42, and the charge transporting layer 43. An area 45a is filled with a high-polymer material, such as polyethylene in which some quantity of carbon black or other pigment is dispersed.

With the sub-electrode 47, a number of elements 47a are arranged in the form of stripes, and the elements 47a are disposed so that they almost orthogonally intersect the elements 46a of the stripe electrode 46. Each element 47a may be located just above the element 46a of the stripe electrode 46, both being disposed so that they are opposed to each other. The sub-electrode 47 may be either permeable or not permeable to the recording light and the reading light.

With this detector 40, a capacitor $C_{*c}$ is formed between the charge storing section 49 and the sub-electrode 47 through a part of the charge transporting layer 43. Providing the sub-electrode 47 will have practically no great effect on the capacitance value $C_a$ of the capacitor $C_{*a}$ formed between the electrode layer 41 and the charge storing section 49 through the photoconductive layer for recording, 42, and the capacitance value $C_b$ of the capacitor $C_{*b}$ formed between the stripe electrode 46 and the charge storing section 49 through the photoconductive layer for reading, 44, and the charge transporting layer 43. The capacitance values of the capacitors are defined by the film thickness ratio as with the detector 10.

This detector 40 is different in configuration from the above-stated detector 30 in that the sub-electrode 47 is provided in the charge transporting layer 43, but there is no great difference in function and effect between the two. However, the sub-electrode 47 can be disposed in a location closer to the charge storing section 49 than with the detector 30, which means, the current $I_c$ read out through the sub-electrode 47 can be increased to above that obtained with the detector 30.

Figure 24A:
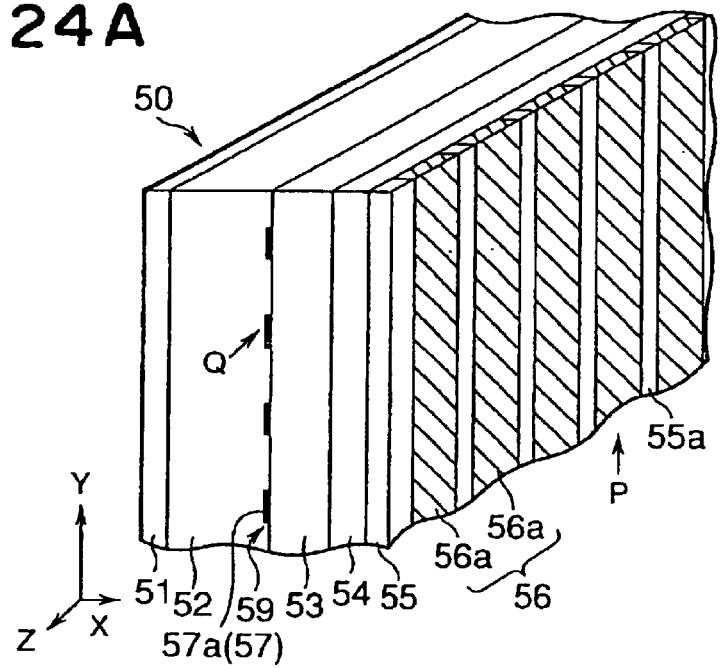
FIG. 24A is a perspective side view of a radiation solid-state detector according to a thirteenth embodiment of the present invention.
Figure 24B:
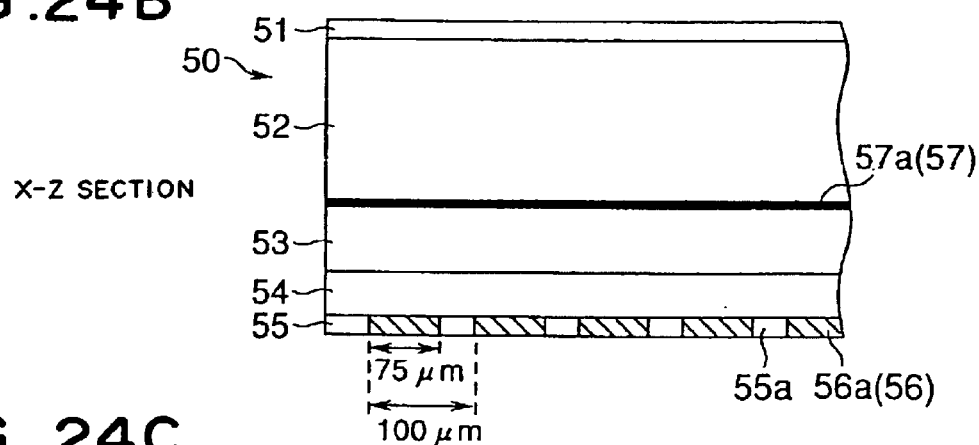
FIG. 24B is an X-z sectional drawing at the portion shown by arrow-Q.
Figure 24C:
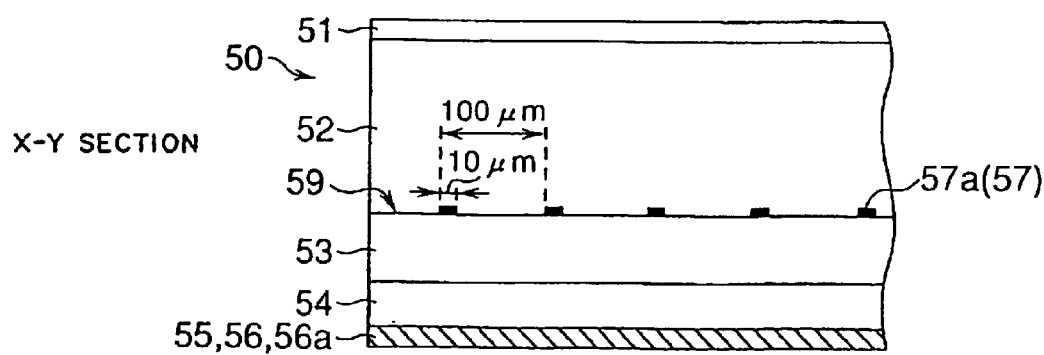
FIG. 24C is an X-Y sectional drawing at the portion shown by the arrow-P.

FIG. 24A to FIG. 24C are drawings illustrating the schematic configuration of a radiation solid-state detector according to a thirteenth embodiment of the present invention, FIG. 24A being a perspective side view, FIG. 24B being an X-Z sectional drawing at the portion shown by arrow-Q, and FIG. 24C being an X-Y sectional drawing at the portion shown by arrow-P.

This detector 50 comprises an electrode layer 51, a photoconductive layer for recording, 52, a charge transporting layer 53, a photoconductive layer for reading, 54, and an electrode layer 55 which are stacked together in this order, providing a sub-electrode 57 at the boundary between the photoconductive layer for recording, 52, and the charge transporting layer 53. As the substances for these layers, the substances for the detector 10, etc. according to the first embodiment are used. As with the detector 10, etc., the electrode of the electrode layer 55 is a stripe electrode 56 with which a number of elements 56a are arranged in the form of stripes. An area 55a is filled with a high-polymer material, such as polyethylene in which some quantity of carbon black or other pigment is dispersed.

The elements 57a are disposed so that they almost orthogonally intersect the elements 56a of the stripe electrode 56. With the detector 50 shown, the pixel pitch is set at 100 μm, the width of the element 56a is at 75 μm, and the width of the element 57a is at 10 μm. To reduce the quantity of the latent image charges to be stored on the elements 57a, the width of the element 57a is narrowed down.

Figure 25A:
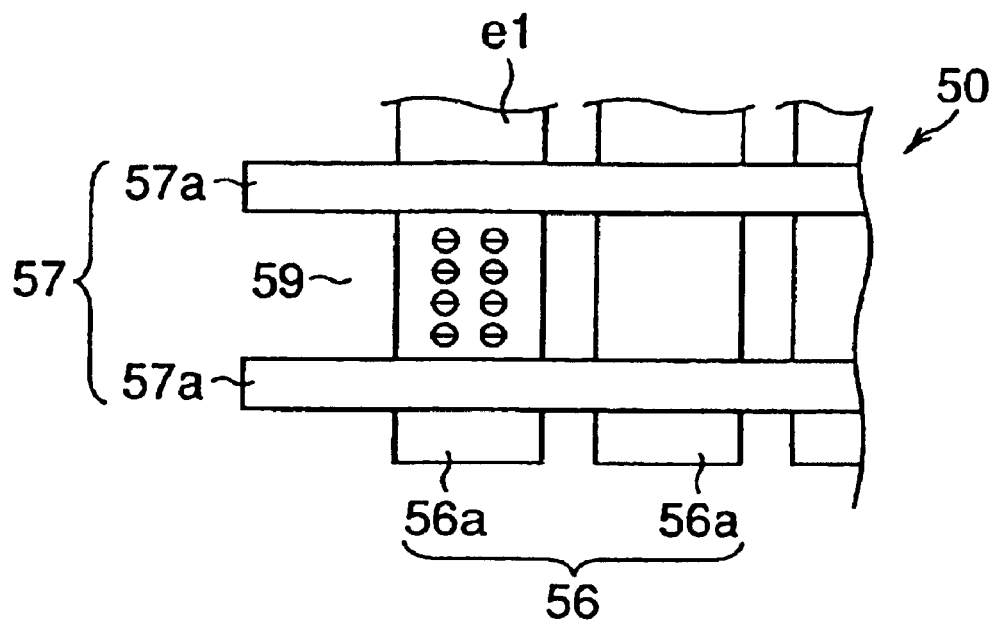
FIG. 25A is an electric charge model illustrating the static latent image recording process.
Figure 25B:
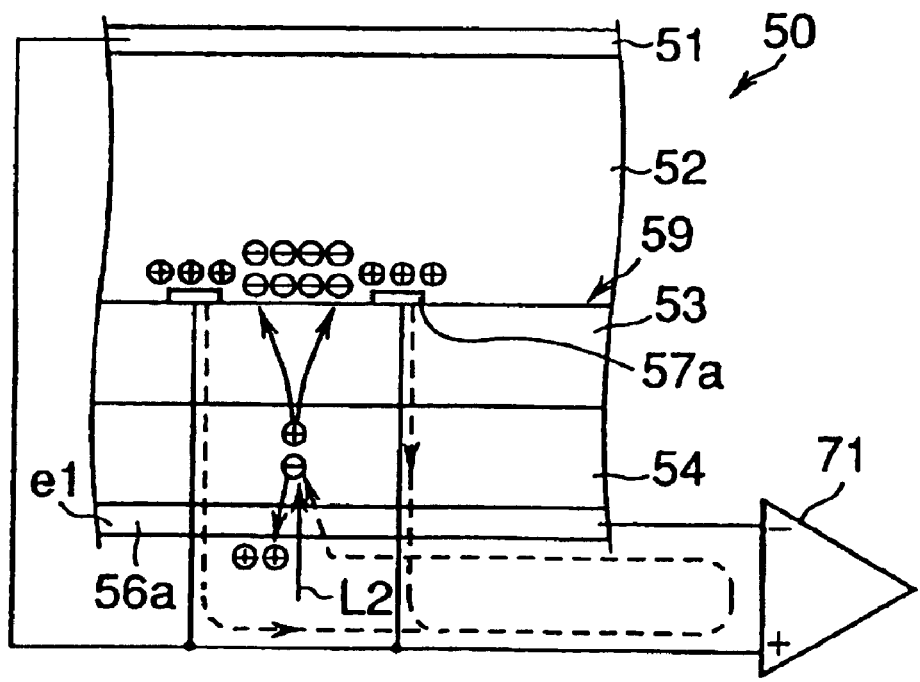
FIG. 25B is an electric charge model illustrating the static latent image reading process, in the case where the radiation solid-state detector of the thirteenth embodiment is used.

FIG. 25A is an electric charge model (a top view) illustrating the static latent image recording process when this detector 50 is used, and FIG. 25B is an electric charge model (an X-Y sectional drawing) illustrating the static latent image reading process for the element 56a having the element No. e1.

In the recording process, all the elements 57a are in the floating state for carrying out the recording. Assuming that the permeating portion 9a of the subject 9 corresponds to the element 56a having the element No. e1, the latent image charges are stored in the portion of the charge storing section 59 which corresponds to the element 56a of the No. e1. In FIG. 25A, it is shown that eight latent image charges are stored.

On the other hand, in the reading process, two elements 57a are simultaneously connected to the non-inverting input terminal of the current detection amplifier 71 and the electrode layer 51 for one pixel to carry out the reading. When the reading light L2 is projected onto the photoconductive layer for reading, 54, the latent image charges in the portion corresponding to the location sandwiched by the two elements 57a are sequentially read out through the two elements 57a. In FIG. 25B, it is shown that six of the eight latent image charges stored in the charge storing section 59 are taken out by the current detection amplifier 71 as signal charges.

Figure 26A:
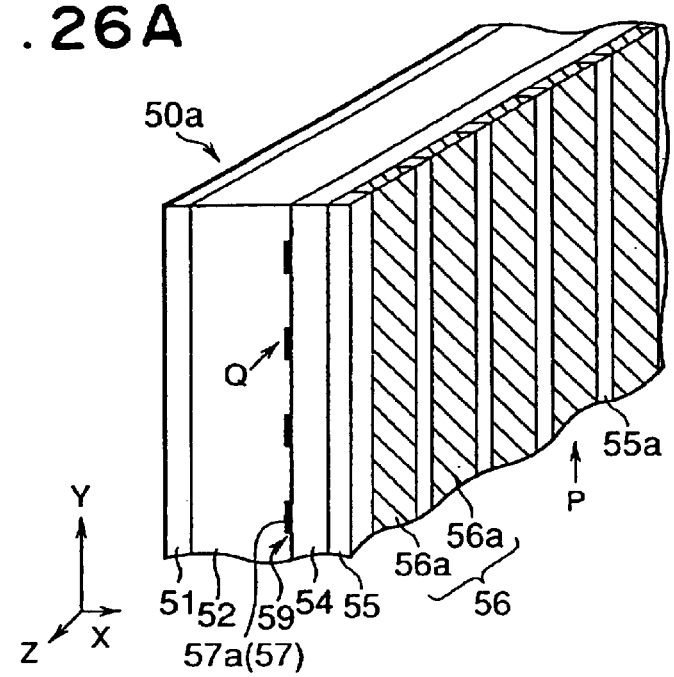
FIG. 26A is a perspective side view of a radiation solid-state detector according to a fourteenth embodiment of the present invention.
Figure 26B:
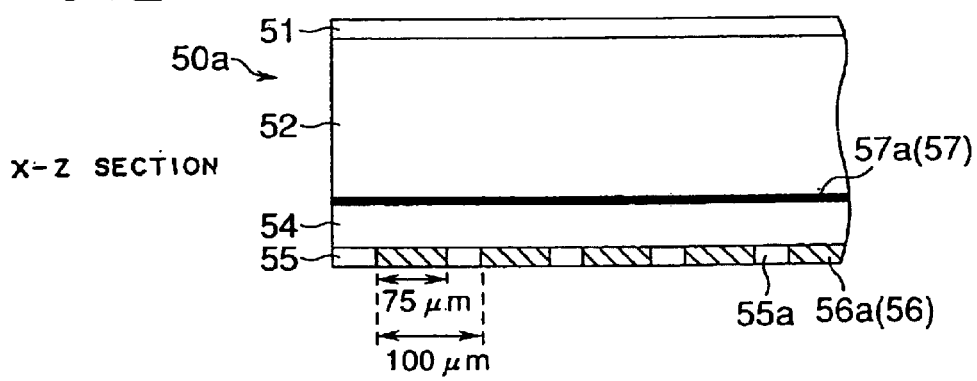
FIG. 26B is an X-Z sectional drawing at the portion shown by arrow-Q.
Figure 26C:
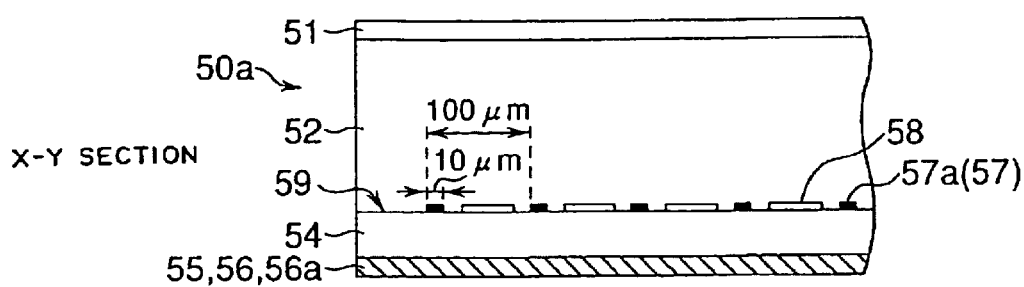
FIG. 26C is an X-Y sectional drawing at the portion shown by arrow-P.

FIG. 26A to FIG. 26C are drawings illustrating the schematic configuration of a radiation solid-state detector according to a fourteenth embodiment of the present invention, FIG. 26A being a perspective side view, FIG. 26B being an X-Z sectional drawing at the portion shown by arrow-Q, and FIG. 26C being an X-Y sectional drawing at the portion shown by arrow-P. In FIG. 26A to FIG. 26C, any element equivalent to that of the detector 50 according to the thirteenth embodiment as shown in FIG. 24A to FIG. 24C is provided with the same reference numeral, and the description about it will be omitted except when required. With this detector 50a according to the fourteenth embodiment of the present invention, the charge transporting layer 53 for the above-stated detector 50 is removed, and the configuration corresponds to that of the above-stated detector 10d, 20c. For each pixel, the microplate 58 is discretely provided just above the element 56a in the location sandwiched by the elements 57a at the boundary between the photoconductive layer for recording, 52, and the photoconductive layer for reading, 54.

Figure 27A:
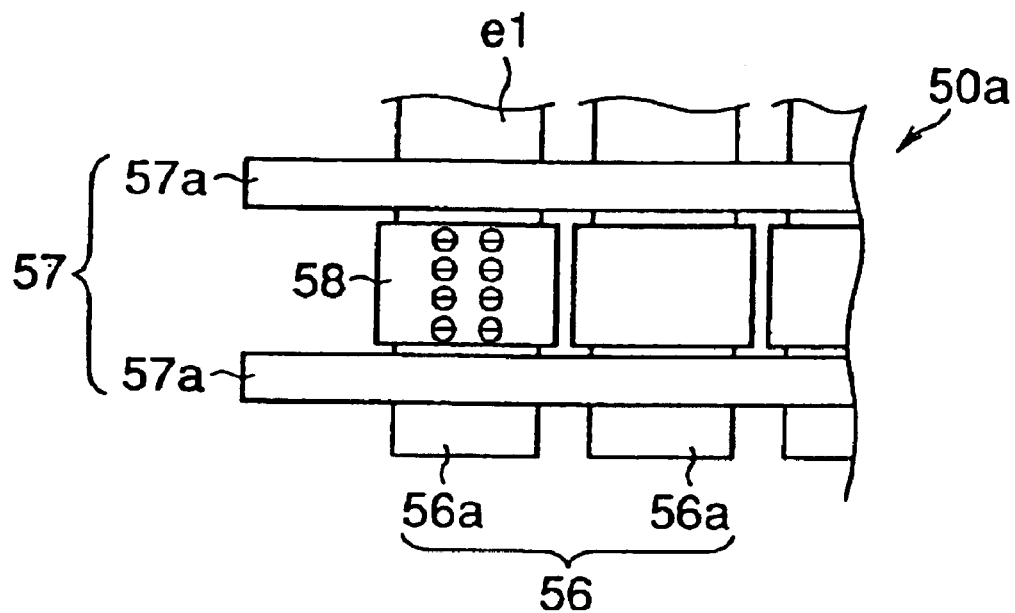
FIG. 27A is an electric charge model illustrating the static latent image recording process.
Figure 27B:
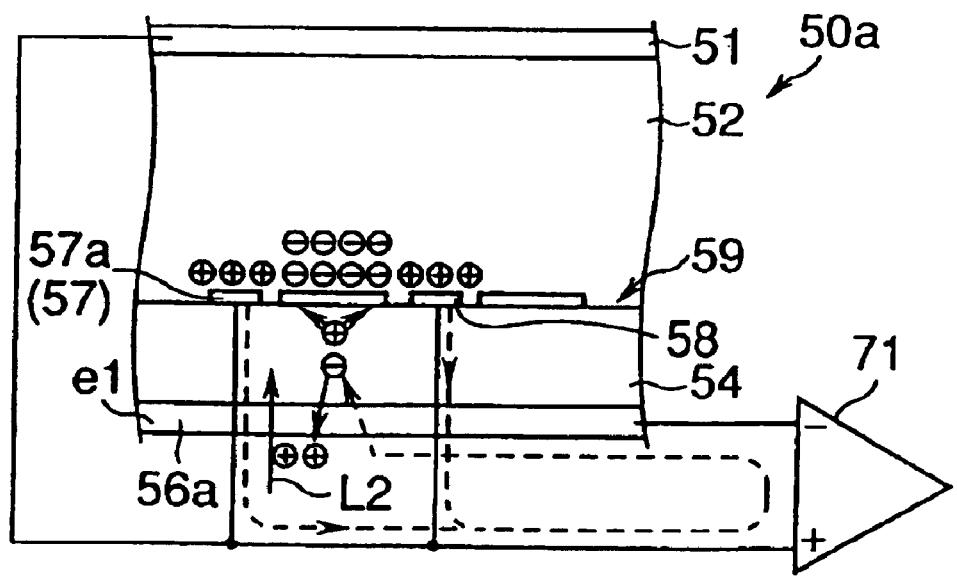
FIG. 27B is an electric charge model illustrating the static latent image reading process, in the case where the radiation solid-state detector of the fourteenth embodiment is used.

FIG. 27A is an electric charge model (a top view) illustrating the static latent image recording process when this detector 50a is used, and FIG. 27B is an electric charge model (an X-Y sectional drawing) illustrating the static latent image reading process for the element 56a having the element No. e1. The detailed description about the functions in the reading process and the recording process will be omitted. With the detector 50a, the function of the above-stated detector 50 is combined with the effects of the microplates 18, 28 in the detectors 10d, 20c.

Up to now, the preferred embodiments of the radiation solid-state detector according to the present invention, and the method and device for recording of radiation image information in the detector, and the method and device for reading out the radiation image information recorded in the radiation solid-state detector according to the present invention have been described, but, the present invention is not limited to the above-stated embodiments, and so long as the gist of the invention is not changed, the invention can be changed in various ways.

For example, with the above-stated embodiments, the first electrode layer on the side where the recording light is projected is connected with the newly provided sub-electrode, and the sum $(I_a+I_c)$ of the current $I_a$ flowing out from the capacitor $C_{*a}$ configured by the first electrode layer and the current $I_c$ flowing out from the capacitor $C_{*c}$ configured by the sub-electrode is detected as a signal current. However, as stated above, with the detector according to the present invention, the capacitance value $C_c$ of the capacitor $C_{*c}$ can be increased to a value sufficiently higher than the capacitance value $C_a$ of the capacitor $C_{*a}$, which means, the current $I_c$ flowing out from the capacitor $C_{*c}$ can be increased to a value sufficiently higher than the current $I_a$ flowing out from the capacitor $C_{*a}$, and if only the current $I_c$ flowing out from the capacitor $C_{*c}$ is detected through the sub-electrode, an image signal larger than that obtained when the sub-electrode is not provided can be taken out. Particularly, with the detector 10, 40, the sub-electrode can be disposed in a location close to the charge storing section, and so, the capacitance value $C_c$ of the capacitor $C_{*c}$ can be increased to a value much higher than the capacitance value $C_a$ of the capacitor $C_{*a}$, which is advantageous.

The basic detector to which the present invention is to be applied may be any detector, provided that it is a detector with which electrodes are stacked so that they sandwich the photoconductive layer for recording and the photoconductive layer for reading, and it is preferable that the present invention be applied to such a detector as that which has been proposed by the present applicant in the above-mentioned Japanese Patent Application No. 10 (1998)-232824, and Japanese Patent Application No. 10 (1998)-271374. The detectors are not limited to those according to the above-stated embodiments, but various variants, such as those having a charge transporting layer made of a different material, and a multilayer configuration, which have been proposed in the above-mentioned Japanese Patent Application No. 10 (1998)-232824, etc., are available, and these can be combined with the disposal of the sub-electrode and the microplate according to the present invention. In this way, while the high speed response in reading is maintained, the reading efficiency can be further improved, and it can be intended to improve the reading resolution and reduce the dark current.

Further, with any of the detectors according to the above-stated embodiments, the electrode of the second electrode layer and the sub-electrode are a stripe electrode, but, the electrodes are not always limited to the stripe electrode. For example, the electrode of the second electrode layer may be a flat plate electrode. The sub-electrode may be configured so that, as with the above-stated microplates, minute electrodes are each disposed so as to correspond to the pixel, and a reading line is provided for each minute electrode for obtaining a signal.

Further, with any of the detectors according to the above-stated embodiments, the photoconductive layer for recording exhibits a conductivity when irradiated with the radiation for recording, but, the photoconductive layer for recording according to the present invention is not always limited to this, and the photoconductive layer for recording may be such that it exhibits a conductivity when irradiated with the light emitted by excitation on the radiation for recording (refer to Japanese Patent Application No. 10 (1998)-232824). In this case, on the surface of the first electrode layer must be stacked a wavelength conversion layer, known as an X-ray scintillator, which wavelength-converts the radiation for recording into light in the other wavelength region, such as blue light. As this wavelength conversion layer, it is preferable to use such a substance as cesium iodide (CsI). The first electrode layer must be permeable to the light emitted in the wavelength conversion layer by excitation on the radiation for recording.

With the detectors 10, 20, 30, 40, 50, etc., a charge transporting layer is provided between the photoconductive layer for recording and the photoconductive layer for reading, and at the boundary between the photoconductive layer for recording and the charge transporting layer, a charge storing section is formed. However, with the present invention, the charge transporting layer may be replaced with a trap layer. When it is replaced with a trap layer, the latent image charges are caught by the trap layer, and they are stored in the trap layer or at the boundary between the trap layer and the photoconductive layer for recording. As with the detector 10, 20, etc., a microplate may be discretely provided for each pixel at the boundary between the trap layer and the photoconductive layer for recording.

With the detectors according to the above-stated embodiments, one square microplate is provided for each pixel. However, the number of microplates may exceed one to some degree, so long as the microplates allow forming a pixel in the fixed location or causing the latent image charges to have the same potential so that the latent image charges around the pixel can be sufficiently discharged in the reading process, or the latent image charges can be concentrated on the pixel central portion in the recording process. For example, four triangular conductive members may be disposed for each pixel so that they form a square as a whole for allowing, in the recording process and the reading process, the latent image charges to be concentrated on the square central portion where the vertexes of the triangular members are collected, or sectorial conductive members may be disposed so that they form a circle as a whole.

What is claimed is:

1. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided in said second electrode layer or between said first electrode layer and said second electrode layer, wherein said first conductive member is provided at a location in said photoconductive layer for recording which is close to said photoconductive layer for reading.

2. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided in said second electrode layer or between said first electrode layer and said second electrode layer, wherein said first conductive member is provided on the face of said photoconductive layer for recording which faces said photoconductive layer for reading.

3. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided in said second electrode layer or between said first electrode layer and said second electrode layer, wherein radiation is projected onto the radiation solid-state detector to store the charges of the quantity corresponding to the dose of the projected radiation in the charge storing section of said radiation solid-state detector as latent image charges for recording of radiation image information as a static latent image in said charge storing section, and wherein a control voltage to adjust the electric field formed between both electrode layers by a DC voltage applied across the first electrode layer and the second electrode layer in said radiation solid-state detector is applied to said first conductive member.

4. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided in said second electrode layer or between said first electrode layer and said second electrode layer, further including a radiation image recording device which projects radiation onto the radiation solid-state detector to store the charges of the quantity corresponding to the dose of the projected radiation in the charge storing section of said radiation solid-state detector as latent image charges for recording of radiation image information as a static latent image in said charge storing section, comprising:

first voltage application means which applies a DC voltage across the first electrode layer and the second electrode layer in said radiation solid-state detector, and control voltage application means for applying, to said first conductive member, a control voltage to adjust the electric field formed between both electrode layers by a DC voltage applied by said first voltage application means.

5. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided between said charge storing section and said second electrode layer.

6. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having a first stripe electrode, formed of a plurality of line-shaped electrodes, that have permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided in said second electrode layer, wherein said first conductive member has a second stripe electrode, formed of a plurality of line-shaped electrodes, and has a shading property with respect to said electromagnetic wave for reading, and wherein the line-shaped electrodes of the second stripe electrode are arranged so that the line-shaped electrodes of the second stripe electrode and the line-shaped-electrodes of the first stripe electrode are alternately disposed.

7. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided between said charge storing section and said second electrode layer, wherein radiation is projected onto the radiation solid-state detector to store the charges of the quantity corresponding to the dose of the projected radiation in the charge storing section of said radiation solid-state detector as latent image charges for recording of radiation image information as a static latent image in said charge storing section, and wherein a control voltage to adjust the electric field formed between both electrode layers by a DC voltage applied across the first electrode layer and the second electrode layer in said radiation solid-state detector is applied to said first conductive member.

8. A radiation solid-state detector which has a charge storing section for storing the charges of the quantity corresponding to the dose of the radiation which has been projected, and records radiation image information as a static latent image in said charge storing section, wherein a first electrode layer having permeability to radiation for recording or light emitted by excitation on the radiation, a photoconductive layer for recording which exhibits conductivity when irradiated with said radiation for recording or said light, a photoconductive layer for reading which exhibits conductivity when irradiated with an electromagnetic wave for reading, and a second electrode layer having permeability to said electromagnetic wave for reading, are provided in this order, and a first conductive member for outputting an electric signal corresponding to the quantity of the latent image charges stored in said charge storing section formed between said photoconductive layer for recording and said photoconductive layer for reading is provided in said second electrode layer, further including a radiation image recording device which projects radiation onto the radiation solid-state detector to store the charges of the quantity corresponding to the dose of the projected radiation in the charge storing section of said radiation solid-state detector as latent image charges for recording of radiation image information as a static latent image in said charge storing section, comprising, first voltage application means which applies a DC voltage across the first electrode layer and the second electrode layer in said radiation solid-state detector, and control voltage application means for applying, to said first conductive member, a control voltage to adjust the electric field formed between both electrode layers by a DC voltage applied by said first voltage application means.

* * * * *